United States Patent [19]

Pfeifer

[11] Patent Number: 4,680,195

[45] Date of Patent: Jul. 14, 1987

[54] HOMOPOLYMERS, COPOLYMERS AND COATED MATERIAL AND ITS USE

[75] Inventor: Josef Pfeifer, Therwil, Switzerland

[73] Assignee: Ciba-Geigy Corporation, Ardsley, N.Y.

[21] Appl. No.: 732,334

[22] Filed: May 10, 1985

[30] Foreign Application Priority Data

May 17, 1984 [CH] Switzerland ............... 2417/84

[51] Int. Cl.[4] ............... C08J 7/04; G03C 5/16
[52] U.S. Cl. ............... 427/44; 427/154; 428/435; 430/270; 522/164; 528/26; 528/27; 528/114; 528/229
[58] Field of Search ............ 528/26, 27, 229, 170, 528/322, 321, 114; 525/408; 427/44, 154; 430/270; 522/164, 173; 428/435, 473.5

[56] References Cited

U.S. PATENT DOCUMENTS

| | | | |
|---|---|---|---|
| 3,275,690 | 9/1966 | Stroh et al. | 260/876 |
| 3,299,101 | 1/1967 | Tocker | 260/346.3 |
| 3,424,718 | 1/1969 | Angelo | 528/26 |
| 3,435,002 | 3/1969 | Holub | 260/46.5 |
| 3,700,497 | 10/1972 | Epifano et al. | 427/89 |
| 3,875,116 | 4/1975 | Heath et al. | 528/26 |
| 4,030,948 | 6/1977 | Berge | 148/33.3 |
| 4,146,723 | 3/1979 | Findeisen et al. | 548/307 |
| 4,197,397 | 4/1980 | D'Alelio | 528/170 |
| 4,385,165 | 5/1983 | Ahne et al. | 528/53 |
| 4,395,527 | 7/1983 | Berger | 528/26 |
| 4,402,907 | 9/1983 | Clark | 422/7 |
| 4,480,009 | 10/1984 | Berger | 528/26 |
| 4,499,149 | 2/1985 | Berger | 428/447 |

FOREIGN PATENT DOCUMENTS

| | | |
|---|---|---|
| 0134752 | 3/1985 | European Pat. Off. |
| 1565700 | 5/1969 | France |
| 1601094 | 9/1970 | France |
| 60-88939 | 5/1985 | Japan |
| 1222630 | 2/1971 | United Kingdom |

OTHER PUBLICATIONS

Chem. Abst. 100, 8733t, (1984).

*Primary Examiner*—Veronica A. Hoke
*Attorney, Agent, or Firm*—Luther A. R. Hall

[57] ABSTRACT

Homopolymers and copolymers which have an average molecular weight of at least 2000 and which contain at least 5 mole %, relative to the polymer, of at least one structural element of the formula I or II

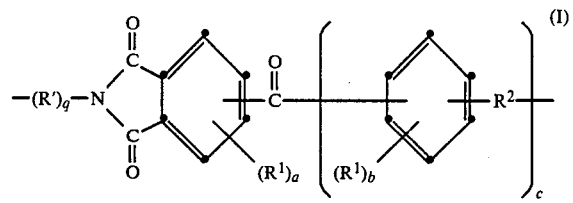

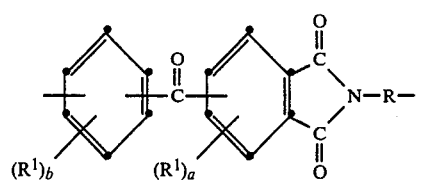

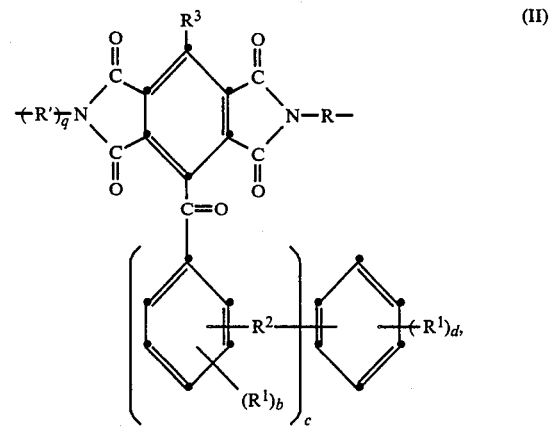

in which and R' are independently alkylene, cycloalkylene, aralkylene or arylene, $R^1$ is halogen, nitro, alkyl, alkoxy, alkylthio, phenyl or aralkyl, $R^2$ is a direct bond, —O—, —S—, methylene, carbonyl or alkylidene, $R^3$ is hydrogen, aroyl or defined as $R^1$, and as integers a is 0 to 3, b is 0 to 4, c is 0 to 5, d is 0 to 5 and q is 0 or 1

The polymers are sensitive to radiation and can be used for the production of protective coatings or photographic relief images.

20 Claims, No Drawings

HOMOPOLYMERS, COPOLYMERS AND COATED MATERIAL AND ITS USE

The present invention relates to homopolymers and copolymers containing benzoyl pyromellitic acid imide units and/or imide units of aromatic tetracarboxylic acids in which the aromatic radicals carrying imide groups are linked via carbonyl groups to aromatic radicals, to a material coated with these polymers and to the use of the coated material for the production of protective films or photographic relief images by irradiation.

Photographic imaging processes using radiation-sensitive polymers for the production of relief images have acquired great importance for the production of components in the electronics industry and semi-conductor technology. Depending on the purpose of the application, certain properties are required from such photopolymers, and a variety of polymers have been disclosed for this purpose. The photosensitivity of such polymers is relatively low, which necessitates the use of photoinitiators or sensitisers in order to achieve economical times of exposure to light. A disadvantage of such additives is that they can impair the mechanical and physical properties.

For certain applications, it is also desirable that the structures produced or photochemically prepared protective coatings should have a high heat resistance. Polyimides are particularly suitable in this respect. Because of their insolubility, it is necessary to use as starting materials soluble precursors which are only converted into polyimides by a subsequent heat treatment after the photopolymerisation. The direct photo-cross-linking of polyimides has not been disclosed hitherto.

Polyimides containing bnzoylpyromellitic or naphtoylpyromellitc acid have been disclosed in British Patent Specification No. 1,222,630. French Patent Specification Nos. 1,601,094 and 1,565,700 describe polyimides of aromatic tetracarboxylic acids in which the aromatic nuclei carrying carboxyl groups are attached to further aromatic nuclei via carbonyl groups. Aromatic polyimides which are substituted in both of the ortho-positions relative to at least one N atom are not mentioned. Nor can it be deduced from the publications that the polyimides are sensitive to radiation.

It has now been found that polymers containing the imide units described are self-crosslinkable by light.

The present invention relates to homopolymers and copolymers which have an average molecular weight of at least 2000 and which contain at least 5 mole %, relative to the polymer, of at least one structural element of the formulae I or II

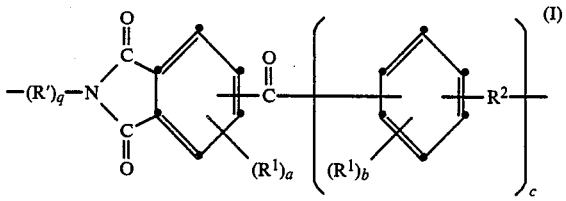

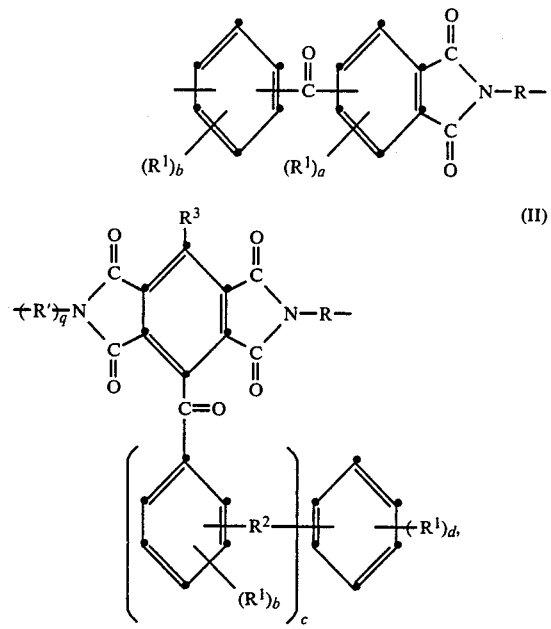

in which $R^1$ is halogen, nitro or $C_1$-$C_6$-alkyl, $C_1$-$C_6$-alkoxy or $C_1$-$C_6$-alkylthio each of which can be substituted by phenyl, or is phenyl, phenoxy or phenylthio, $R^2$ is a direct bond or a bridge group, $R^3$ is a hydrogen atom or aroyl or is as defined for $R^1$, a is 0, 1, 2 or 3, b is 0, 1, 2, 3 or 4, c and d are 0, 1, 2, 3, 4 or 5 and q is 0 or 1, a, b and d are 2, the two $R^1$s are attached in the o-position and together are —CH=CH—CH=CH—, and R and R' are a substituted or unsubstituted divalent aliphatic radical which can be interrupted by heteroatoms or by aromatic, heterocyclic or cycloaliphatic groups, or are a substituted or unsubstituted, cycloaliphatic or araliphatic radical, an aromatic radical in which two aryl nuclei are linked via an aliphatic group, or an aromatic radical which is substituted by at least one alkyl group, cycloalkyl group, alkoxy group, alkoxyalkyl group, alkylthio group, alkylthioalkyl group or aralkyl group, or two adjacent C atoms of the aromatic radical are substituted by an alkylene group, R being an aromatic radical which is substituted in the two ortho-positions relative to at least one N atom, if q is 0.

The polymers have average molecular weights (number-average) of, preferably, at least 5,000. The upper limit depends essentially on properties which determine the processability, for example the solubility of the polymers. The upper limit, can be up to 500,000, preferably up to 100,000 and especially up to 60,000. The polymers can also be statistical polymers or block polymers.

The proportion of structural elements of the formulae I and/or II depends essentially on the photosensitivity desired for the homopolymers or copolymers and on their structure. The proportion can be 5 to 100 mole %, preferably 20 to 100 mole %, particularly 40 to 100 mole % and especially 50 to 100 mole %, relative to the polymer. Homopolymers and copolymers containing 80–100 mole % of structural elements of the formulae I and/or II are very particularly preferred.

In homopolymers or copolymers containing structural elements of the formula I and/or II in which R and R' are an aliphatic or cycloaliphatic radical, the proportion of these structural elements is preferably at least 50 mole %, particularly if the homopolymers and copolymers are polyamides and polyesters.

As halogen, $R^1$ is preferably F or Cl. Examples of $R^1$ as alkyl, alkoxy and alkylthio are methyl, ethyl, propyl, i-propyl, butyl, pentyl, hexyl, methoxy, ethoxy, propoxy, methylthio, ethylthio and benzylthio.

In the formulae I and II, a, b and d are preferably 1 and especially 0, and c is preferably 1 or 2 and especially 0.

The bridge group $R^2$ can, for example, be radicals such as —O—, —S—, —SO—, —SO$_2$—, —CO—, —N-$R^a$—, linear or branched $C_1$-$C_{10}$-alkylene which can be substituted by F or Cl, —CO$_2$—, —CONR$^a$—,

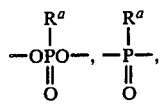

$C_2$—$C_6$-alkylidene which can be substituted by F or Cl, cycloalkylidene having 5 or 6 ring carbon atoms, —(O—$C_mH_{2m}$—)$_n$O— in which m is 2 to 4 and n is 1 to 4, or

in which n is 1 to 4. $R^a$ can be $C_1$-$C_6$-alkyl, phenyl, benzyl or cyclohexyl.

Further examples of bridge groups are —N=N—,

and

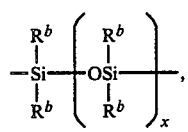

in which $R^b$ is $C_1$-$C_6$-alkyl, particularly methyl, or phenyl or benzyl and x is a rational number from 1 to 10.

$R^2$ is preferably a direct bond, —O—, —S—, CH$_2$, ethylidene, 2,2-propylidene and, in particular, —CO—.

As aroyl, $R^3$ is, in particular, benzoyl. Preferably, $R^3$ is a hydrogen atom.

The carbonyl groups in formula I are preferably in the meta-position relative to the carbonyl groups of the imide group. If c is 0, the carbonyl groups are also preferably in the meta-position relative to one another. The $R^2$ group can be in the para-position, but is more preferably in the meta-position, relative to the carbonyl groups.

Preferred structural elements have the formulae Ia and IIa

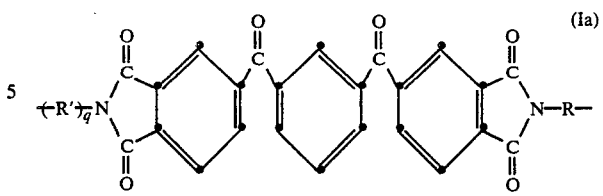

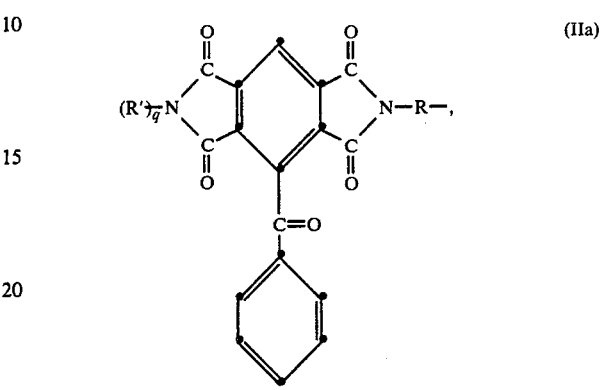

in which q, R and R' are as defined in claim 1.

When R or R' in the formulae I and II is a divalent aliphatic radical, it preferably contains 2 to 30, particularly 6 to 30 and especially 6 to 20, C atoms. In a preferred subgroup, R or R' is linear or branched alkylene which can be interrupted by oxygen atoms, S, SO, SO$_2$, NH, NR, $c^{\oplus}NR_2G^{\ominus}$, cyclohexylene, naphthylene, phenylene or hydantoin radicals. $R^c$ can, for xample, be alkyl having 1 to 12 C atoms or cycloalkyl having 5 or 6 ring C atoms, phenyl or benzyl. $G^{\ominus}$ is an anion of a protic acid, for example halide, sulfate or phosphate. In a preferred embodiment, R and R' are linear or branched alkylene having 6 to 30 C atoms, —(CH$_2$-)$_m$—$R^4$—(CH$_2$)$_n$— in which $R^4$ is phenylene, naphthylene, cyclopentylene or cyclohexylene and m and n independently of one another are the number 1, 2 or 3, —$R^5$—(O$R^6$)$_p$— O—$R^5$— in which $R^5$ is ethylene, 1,2-propylene, 1,3-propylene or 2-methyl-1,3-propylene and $R^6$ is ethylene, 1,2-propylene, 1,2-butylene, 1,3-propylene or 1,4-butylene and p is a number from 1 to 100, or

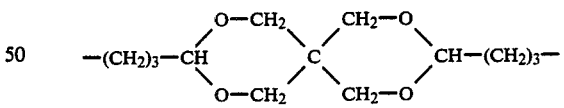

The following are examples of aliphatic radicals: methylene, ethylene, 1,2-propylene, 1,3-propylene, 2,2-dimethyl-1,3-propylene, 1,2-, 1,3- or 1,4-butylene, 1,3-pentylene or 1,5-pentylene, hexylenes, heptylenes, octylenes, decylenes, dodecylenes, tetradecylenes, hexadecylenes, octadecylenes, eicosylenes, 2,4,4-trimethylhexylene, 1,10-dialkyldecylene in which the alkyl preferably has 1 to 6 C atoms, substituted 1,11-undecylenes such as are described, or example, in EP B-0,011,559, Jeffamines, for example

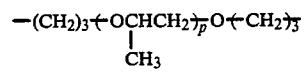

in which p is 1 to 100 or —(CH₂)₃(O(CH₂)₄)ₚO—(CH-2—)₃ in which p is 1–100, dimethylenecyclohexane, xylylene and diethylenebenzene. Particularly preferably, R and R' are branched alkylene having a fairly long chain, for example having 8 to 30 C atoms.

As an aliphatic radical, R and R' in the formulae I and II can also be a polysiloxane radical of the formula

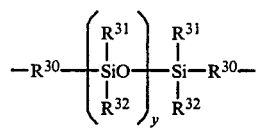

in which $R^{31}$ and $R^{32}$ are $C_1-C_6$-alkyl, particularly methyl, or phenyl, $R^{30}$ is cycloalkylene, for example cyclohexylene, and particularly $C_1-C_{12}$-alkylene, especially $C_1-C_6$-alkylene, for example 1,3-propylene or 1,4-butylene and y is a rational number of at least 1, for example 1 to 100, preferably 1 to 10. Diamines of this type, containing this radical, are described in U.S. Pat. Nos. 3,435,002 and 4,030,948.

Examples of aliphatic radicals interrupted by heterocyclic radicals are those derived from N,N'-aminoalkylated hydantoins or benzimidazoles. Examples are N,N'-(γ-aminopropyl)-5,5-dimethylhydantoin or N,N'-(γ-aminopropyl)-benzimidazolone and those of the formula

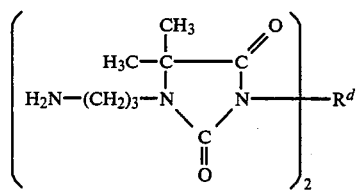

in which $R^d$ is alkylene having 1 to 12, preferably 1 to 4, C atoms, or

in which $R^3$ is a hydrogen atom or methyl and e is an integer from 1 to 20.

Examples of suitable substituents for the aliphatic radicals are hydroxyl, halide, such as F or Cl, or alkoxy having 1 to 6 C atoms.

Heterocyclic diamine radicals are preferably derived from N-heterocyclic diamines, for example pyrrolidine, indole, piperidine, pyridine or pyrrole, in which the N atom can be alkylated, for example methylated. An example is N-methyl-4-amino-5-aminomethylpiperidine.

When R and R' in the formulae I and II are a divalent cycloaliphatic radical, they preferably contain 5 to 8 ring C atoms and are mononuclear or dinuclear cycloalkylene which has 5 to 7 ring C atoms in one ring and is especially unsubstituted or is substituted by alkyl, preferably containing 1 to 4 C atoms. In a preferred embodiment, R and R' as a cycloaliphatic radical are radicals of the formulae

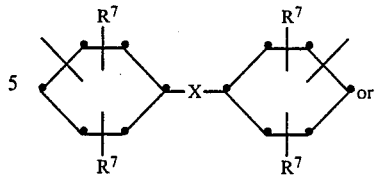

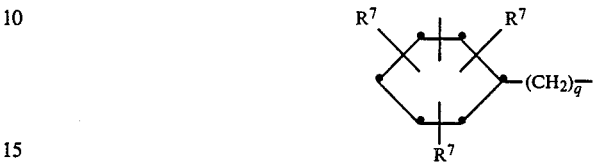

in which q is 0 or 1, the $R^7$s independently are hydrogen or alkyl having 1 to 6 C atoms and X is a direct bond, O, S, SO₂, alkylene having 1 to 3 C atoms or alkylidene having 2 to 6 C atoms. $R^7$ is preferably a hydrogen atom, ethyl and methyl, X is preferably methylene and the alkylidene radical preferably contains 2 or 3 C atoms, such as ethylidene, 1,1-propylidene or 2,2-propylidene.

The following are examples of R and R' as cycloalkylene: 1,2-cyclopentylene, 1,3-cyclopentylene, 1,2-, 1,3- or 1,4-cyclohexylene, cycloheptylene, cyclooctylene, methylcyclopentylene, methylcyclohexylene, dimethylcyclohexylene, 3-methylcyclohex-1-yl, 4-methylcyclohex-1-yl, 5-methyl-3-methylenecyclohex-1-yl, 3,3'-biscyclohexylene, 4,4'-biscyclohexylene, 3,3'-dimethyl-4,4'-biscyclohexylene, 4,4'-biscyclohexylene ether, 4,4'-biscyclohexylene sulfone, 4,4'-biscyclohexylenemethane or 4,4'-biscyclohexylene-2,2-propane, and also the radicals of bisaminomethyltricyclodecane, bisaminomethylnorbornane and methanediamine.

As a cycloaliphatic radical, R and R' are particularly preferably 1,4-cyclohexylene, 1,3-cyclohexylene, 2,2,6-trimethyl-6-methylenecyclohex-4-yl, Methylenebis-(cyclohex-4-yl) or methylenebis(3-methylcyclohex-4-yl).

As an araliphatic radical, R and R' preferably contain 7 to 30 C atoms. If the aromatic group of the araliphatic radical is attached to the N atoms in the radical of the formulae I and II, which is preferable, these aromatic groups are preferably substituted in the same way that R and R' are substituted as an aromatic radical, including the preferences.

The araliphatic radical preferably contains 7 to 30, especially 8 to 22, C atoms. The aromatic radical in the araliphatic radical is preferably a phenyl radical. When R and R' are an araliphatic radical, they are aralkylene which is especially unsubstituted or is substituted on the aryl group by alkyl, the alkylene radical being linear or branched. In a preferred embodiment, the araliphatic radical has the formula

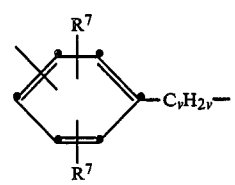

in which the $R^7$s independently of one another are a hydrogen atom or, especially, alkyl having 1–6 C atoms, and v is an integer from 1 to 20.

The free bond can be in the o-position, m-position, and, in particular, in the p-position relative to the $C_vH_{2v}$ group, and one or both $R^7$s are preferably attached in the o-position relative to the free bond.

The following are examples of R and R' as an araliphatic radical: m-benzylene, p-benzylene, 3-methyl-p-benzylene, 3-ethyl-p-benzylene, 3,5-dimethyl-p-benzylene, 3,5-diethyl-p-benzylene, 3-methyl-5-ethyl-p-benzylene, p-phenylenepropylene, 3-methyl-p-phenylenepropylene, p-phenylenebutylene, 3-ethyl-p-phenylenepentylene and, in particular, phenylenealkylene radicals having fairly long chains, which are described, for example, in EP A-0.069,062: 6-(p-phenylene)-6-methylhept-2-yl, 6-(3'-methyl-p-phenylene)-6-methylhept-2-yl, 6-(3'-ethyl-p-phenylene)-6-methylhept-2-yl, 6-(3',5'-dimethyl-p-phenylene)-6-methylhept-2-yl, 11-(p-phenylene)-2,11-dimethyldodec-1-yl and 13-(p-phenylene)-2,12-dimethyltetradec-3-yl.

R and R' can also be an aromatic radical which preferably has 13 to 30 C atoms and in which two aryl nuclei, for example naphthyl and especially phenyl, are linked via an aliphatic group having, preferably, 1 to 12 C atoms.

This radical has, in particular, the formula

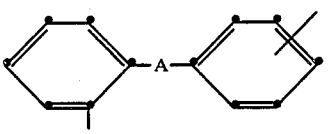

in which the free bond is attached in the p-, m- and, especially, o-position relative to the A group, and A is $C_1$-$C_{12}$-alkylene, especially $C_1$-$C_6$-alkylene, which can be interrupted by O or S. Examples of A are ethylene, 1,2-propylene, 1,3-propylene, butylene, —CH$_2$—O—CH$_2$—, —CH$_2$—S—CH$_2$ and —CH$_2$CH$_2$—O—CH$_2$CH$_2$—.

Homopolymers and copolymers which are particularly preferred are those containing structural elements of the formulae I and II in which R and R' are substituted aromatic radicals. The substituent on the aromatic radical preferably contains 1 to 20, prticularly 1–12 and especially 1–6, C atoms. The substituent is, especially, $C_5$-cycloalkyl, $C_6$-cycloalkyl, linear or branched alkyl, alkoxy, alkoxyalkyl, alkylthio or alkylthioalkyl each of which has 1 to 6 C atoms, or benzyl, trimethylene or tetramethylene. More preferably, the substituent is alkyl, alkoxy or alkoxyalkyl each of which has 1 to 6 C atoms, or benzyl, trimethylene or tetramethylene. Most particularly, the substituent is $C_1$-$C_4$-alkyl. Alkoxyalkyl is preferably alkoxymethyl, and alkoxy is preferably methoxy. The following are examples of the substituent: methyl, ethyl, propyl, isopropyl, n-butyl, isobutyl, pentyl, hexyl, octyl, dodecyl, tetradecyl, eicosyl, methoxy, ethoxy, propoxy, butoxy, pentoxy, hexoxy, methoxymethyl, methoxyethyl, ethoxymethyl, propoxymethyl, butoxymethyl, benzyl, methylbenzyl, phenylethyl, methylthio, ethylthio, hydroxyethyl, methylthioethyl and hydroxyethylthio. Preferred radicals are methoxymethyl, ethoxymethyl, methyl, ethyl, n-propyl, i-propyl, trimethylene, tetramethylene, cyclopentyl and cyclohexyl. Methyl, ethyl and i-propyl are particularly preferred. The substituted aromatic radical can be mononuclear or polynuclear radicals, particularly dinuclear radicals. Mononuclear radicals can contain 1 to 4, preferably 1 or 2, substituents, and dinuclear radicals can contain 1 to 4, preferably 1 or 2, substituents in each nucleus. It has been found that the photosensitivity of homopolymers or copolymers is particularly high when one or two substituents are attached in the ortho-position relative to the N atom. Substitution in the ortho-position is therefore preferred. The aromatic radical is preferably attached in the meta-position or para-position relative to the N atom.

As an aromatic radical, R and R' can contain 7 to 30, especially 7 to 20, C atoms. The aromatic radical is preferably a hydrocarbon radical or pyridine radical which is substituted as defined above.

A preferred subgroup is formed by aromatic radicals of the formula

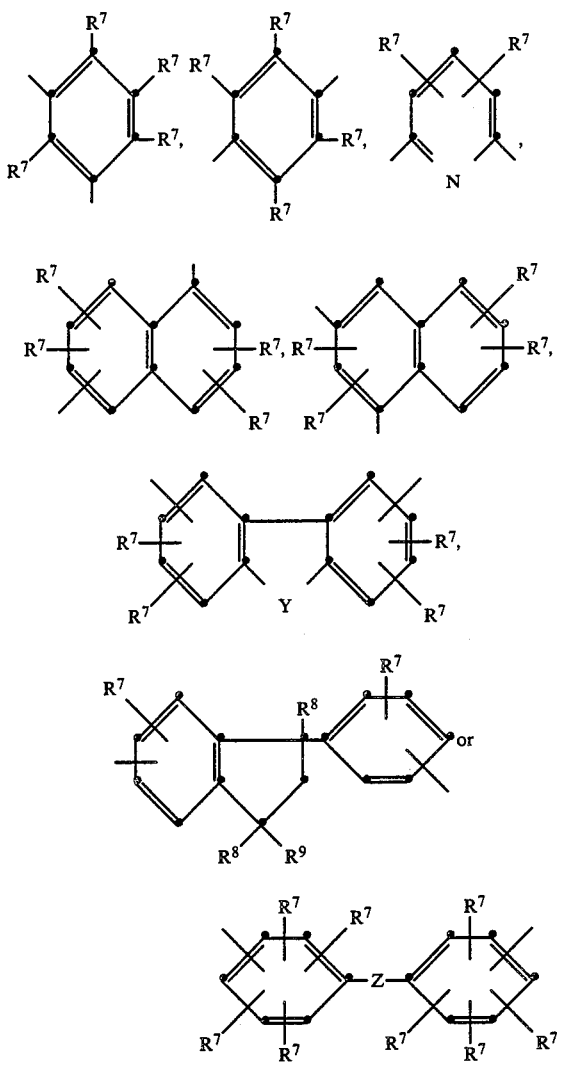

in which, in the case of monosubstitution, $R^7$ is alkyl having 1 to 6 C atoms and the other $R^7$s are hydrogen, and, in the case of disubstitution, trisubstitution or tetrasubstitution, two $R^7$s are alkyl having 1 to 6 C atoms and the other $R^7$s are a hydrogen atom or alkyl having 1 to 6 C atoms, or, in the case of disubstitution, trisubstitution or tetrasubstitution, two vicinal $R^7$s in the phenyl ring are trimethylene or tetramethylene and the other $R^7$s are a hydrogen atom or alkyl having 1 to 6 C atoms, Y is O, S, NH, CO or $CH_2$, $R^8$ is a hydrogen atom or alkyl having 1 to 5 C atoms and $R^9$ is alkyl having 1 to 5 C atoms, and Z is a direct bond, O, S, SO, SO₂, CO,

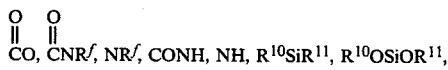

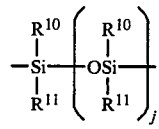

alkylene, which has 1 to 6 C atoms and can be interrupted by —O— or —S—, alkenylene or alkylidene having 2 to 6 C atoms, phenylene or phenyldioxy in which formulae $R^{10}$ and $R^{11}$ independently of one another are alkyl having 1 to 6 C atoms or phenyl and j is 1-10, especially 1-3, and $R^f$ is $C_1$-$C_6$-alkyl, phenyl or benzyl. Z can also have the formula

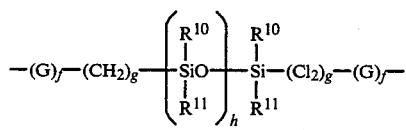

in which G is S and particularly O, f is O or particularly 1, g is 1 to 6 is 1 to 50, particularly 1 to 10, and $R^{10}$ and $R^{11}$ are as defined above, and also a radical of the formula

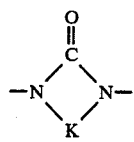

in which K is

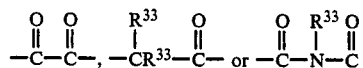

in which $R^{33}$ is H, $C_1$-$C_6$-alkyl or phenyl. $R^8$ and $R^9$ are preferably methyl, Y is preferably —CH₂— or —O—, and Z is preferably a direct bond, —O—, —CH₂— or alkylidene having 2 to 4 C atoms. $R^{10}$ and $R^{11}$ are especially methyl, ethyl and phenyl. The alkylene radical preferably contains 2 to 4 C atoms and is especially ethylene. Alkenylene is especially ethenylene.

A preferred subgroup is formed by toluylene radicals, radicals of O,O'-substituted diaminodiphenylenes, diaminodiphenylmethanes and diaminodiphenyl ethers.

A particularly preferred group is formed by aromatic radicals of the formulae

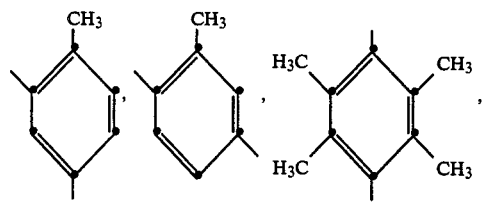

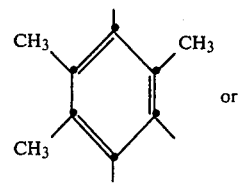

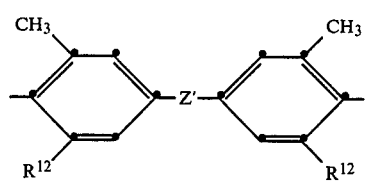

in which Z' is a direct bond, O and especially CH₂, and $R^{12}$ is a hydrogen atom, methyl, ethyl or isopropyl.

The following are examples of substituted aromatic radicals: 4-methyl-1,3-phenylene, 4-ethyl-1,3-phenylene, 2-methyl-1,3-phenylene, 4-benzyl-1,3-phenylene, 4-methoxymethyl-1,3-phenylene, tetrahydro-1,3-naphthylene, tetrahydro-1,4-naphthylene, 3-propyl-1,3-phenylene, 3-propyl-1,4-phenylene, 3-isopropyl-1,4-phenylene, 3,5-dimethyl-1,4-phenylene, 2,4-dimethyl-1,3-phenylene, 2,3-dimethyl-1,4-phenylene, 5-methyl-1,3-phenylene, 2,3,5,6-tetramethyl-1,4-phenylene, 2,3,5,6-tetramethyl-1,3-phenylene, 3-methyl-2,6-pyridinediyl, 3,5-dimethyl-2,6-pyridinediyl, 3-ethyl-2,6-pyridinediyl, 1-methyl-2,7-naphthylene, 1,6-dimethyl-2,7-naphthylene, 1-methyl-2,4-naphthylene, 1,3-dimethyl-2,4-naphthylene, the divalent radicals of 5-amino-1-(3'-amino-4'-methylphenyl)-1,3,3-trimethylindane or 6-amino-5-methyl-1-(3'-amino-4'-methyl)-1,3,3-trimethylindane, 4-methoxymethyl-1,3-phenylene, 3-methyl-p-biphenylylene, 3-ethyl-p-biphenylylene, 3,3'-dimethyl-p-biphenylylene, 3,3'-diethyl-p-biphenylylene, 3-methyl-3'-ethyl-p-biphenylylene, 3,3',5,5'-tetramethylbiphenylylene, 3,3'-methyl-5,5'-ethyl-p-biphenylylene, 4,4'-dimethyl-m-biphenylylene, 3,3'-diisopropylbiphenylylene and radicals of the formulae

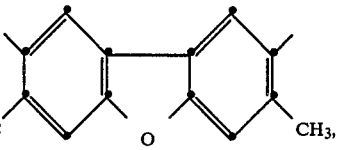

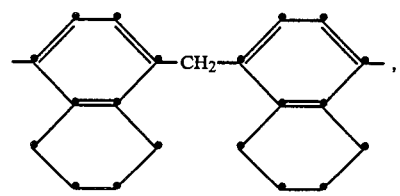

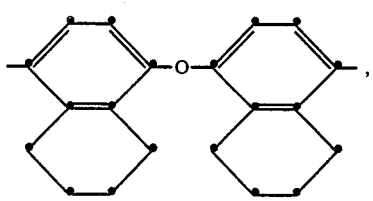

-continued

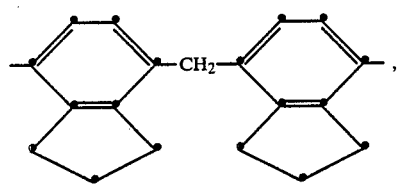

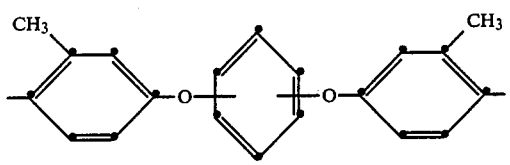

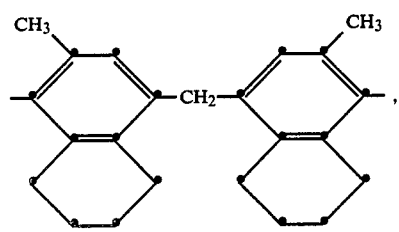

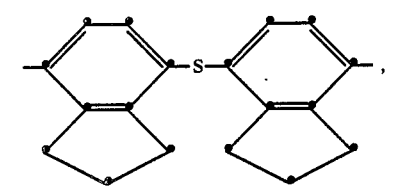

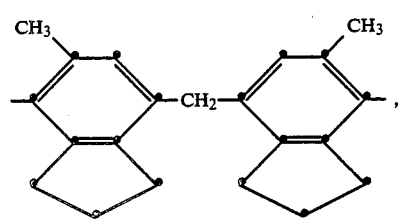

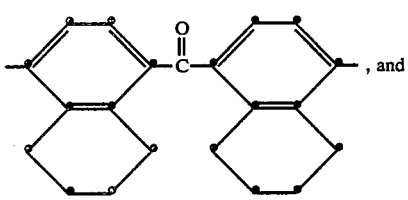

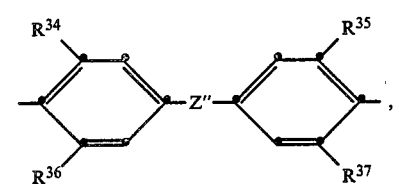

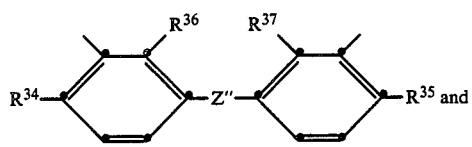

-continued

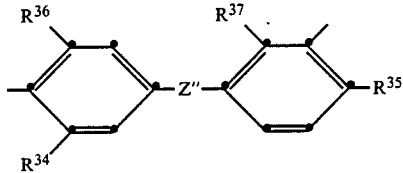

in which $Z''$, $R^{34}$, $R^{35}$, $R^{36}$ and $R^{37}$ are as defined in the table below. In these radicals the phenyl nuclei can be substituted by a further 1 or 2 radicals, for example those defined by $R^{34}$ to $R^{37}$. Examples of such diamino radicals are mentioned below for the homopolyimides and copolyimides according to the invention.

| $Z''$ | $R^{34}$ | $R^{35}$ | $R^{36}$ | $R^{37}$ |
|---|---|---|---|---|
| CH$_2$ | Methyl | Methyl | — | — |
| CH$_2$ | Methyl | Ethyl | — | — |
| CH$_2$ | Ethyl | Ethyl | — | — |
| CH$_2$ | Isopropyl | Isopropyl | — | — |
| CH$_2$ | Methoxymethyl | | — | — |
| CH$_2$ | Benzyl | Benzyl | — | — |
| CH$_2$ | Methyl | Methyl | H | H |
| CH$_2$ | Ethyl | Ethyl | H | H |
| CH$_2$ | Isopropyl | Isopropyl | H | H |
| CH$_2$ | Methoxymethyl | | H | H |
| CH$_2$ | Methyl | Ethyl | H | H |
| CH$_2$ | Methoxymethyl | | Methoxymethyl | |
| CH$_2$ | Methyl | Methyl | Methyl | Methyl |
| CH$_2$ | Ethyl | Ethyl | Ethyl | Ethyl |
| CH$_2$ | Methyl | Methyl | | |
| CH$_2$ | | | Isopropyl | Isopropyl |
| CH$_2$ | Isopropyl | Isopropyl | Isopropyl | Isopropyl |
| CH$_2$ | Isopropyl | Isopropyl | H | H |
| CH$_2$ | Methoxy | Methoxy | H | H |
| O | Methyl | Methyl | — | — |
| O | Ethyl | Ethyl | — | — |
| O | Methyl | Methyl | H | H |
| O | Methyl | Methyl | Methyl | Methyl |
| O | Methyl | Methyl | Ethyl | Ethyl |
| S | Methyl | Methyl | — | — |
| S | Ethyl | Ethyl | — | — |
| S | Methyl | Methyl | H | H |
| S | Methyl | Methyl | Methyl | Methyl |
| S | Ethyl | Ethyl | Ethyl | Ethyl |
| S | Methyl | Methyl | Ethyl | Ethyl |
| CO | Methyl | Methyl | — | — |
| CO | Methyl | Methyl | H | H |
| CO | Methyl | Methyl | Methyl | Methyl |
| SO$_2$ | Methyl | Methyl | — | — |
| SO$_2$ | Methyl | Methyl | H | H |
| SO$_2$ | Methyl | Methyl | Methyl | Methyl |
| SO$_2$ | Ethyl | Ethyl | Methyl | Methyl |
| SO | Methyl | Methyl | — | — |
| SO | Methyl | Methyl | H | H |
| COO | Methyl | Methyl | H | H |
| COO | Methyl | Methyl | Methyl | Methyl |
| CONCH$_3$ | Methyl | Methyl | H | H |
| NCH$_3$ | Methyl | Methyl | — | — |
| NCH$_3$ | Methyl | Methyl | Methyl | Methyl |
| CONH | Methyl | Methyl | — | — |
| NH | Ethyl | Ethyl | H | H |
| NH | Methyl | Methyl | — | — |
| Si(Methyl)$_2$ | Methyl | Methyl | — | — |
| Si(Phenyl)$_2$ | Methyl | Methyl | Methyl | Methyl |
| Si(OMethyl)$_2$ | Ethyl | Ethyl | — | — |
| Si(OPhenyl)$_2$ | Methyl | Methyl | H | H |
| Ethylene | Methyl | Methyl | — | — |
| Ethylene | Methyl | Methyl | Methyl | Methyl |
| Ethylene | Ethyl | Ethyl | H | H |
| Ethylene | Methyl | Methyl | — | — |
| Phenylene | H | H | Methyl | Methyl |
| Phenylene | Alkyl | Alkyl | — | — |
| (CH$_3$)$_2$C$\diagdown^{\diagup}$ | Methyl | Methyl | H | H |

-continued

| Z" | R³⁴ | R³⁵ | R³⁶ | R³⁷ |
|---|---|---|---|---|
| (CH₃)₂C< | Methyl | Methyl | Methyl | Methyl |
| (CF₃)₂C< | Methyl | Methyl | Methyl | Methyl |

The diamines from which R and R' are derived are known or can be prepared by known processes. Diamines containing polysiloxane units are disclosed in U.S. Pat. No. 3,435,002 and EP A-0,054,426. Diamines containing the

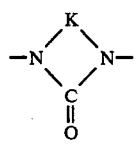

group are mentioned in DE A-2,318,170. The homopolymers and copolymers according to the invention are prepared by conventional processes in equipment intended for this purpose. The polymers preferably have a linear structure. They can, however, also be branched by means of small amounts of at least trifunctional compounds.

The homopolymers or copolymers are preferably selected from the group comprising polyimides, polyamides, saturated polyesters, polycarbonates, polyamide-imides, polyester-imides, polyester-amides, polysiloxanes, unsaturated polyesters, epoxide resins, aromatic polyethers, aromatic polyether-ketones, aromatic polyether-sulfones, aromatic polyketones, aromatic polythioethers, aromatic polyimidazoles, aromatic polypyrroles or mixtures of these polymers.

The polymer which is very paticularly preferred is a homopolyimide or copolyimide containing 5 to 100 mole % of structural elements of the formulae I and/or II in which q is O and R is an aromatic radical which is substituted in the two ortho-positions of at least one N atom by alkyl, cycloalkyl, alkoxy, alkoxyalkyl, alkylthio, alkylthioalkyl or aralkyl, or two adjacent C atoms of the aromatic radical are substituted by alkylene, and containing 0 to 95 mole % of structural elements of the formula III

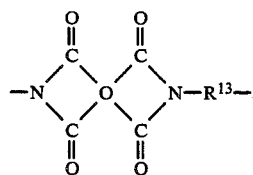

(III)

in which Q is a tetravalent organic radical and R¹³ is a divalent organic radical or R¹³ is as defined for R.

In the copolyimides, R and R¹³ are especially aromatic organic radicals. The most preferred copolyimides contain at least 50 mole %, preferably 80 mole %, of structural elements of the formula I and/or II.

It is known that some aliphatic and aromatic diamines, for example phenylenediamine or di-(aminophenyl)-methane, can promote the insolubility of polyimides. Such diamines are therefore preferably employed in fairly small amounts. Especially in this case, the structural elements of the formulae I and/or II are present in a proportion of at least 50 mole %, particularly 80 mole % and very particularly 90 mole %.

As a tetravalent aromatic radical, Q preferably contains 6 to 30, especially 6 to 20, C atoms.

Q in formula III can be selected from the following groups: aromatic, aliphatic, cycloaliphatic or heterocyclic groups or combinations of aromatic and aliphatic groups. The groups can also be substituted. The group Q can comprise the following structures:

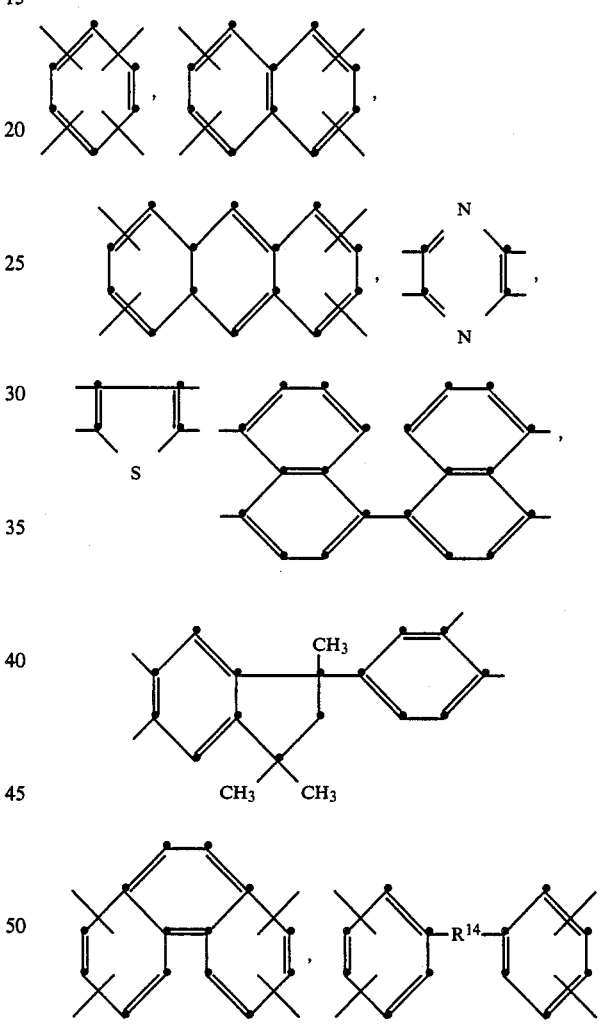

in which R¹⁴ is a direct bond or a bridge group of the formulae

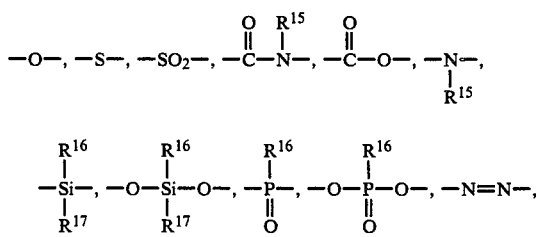

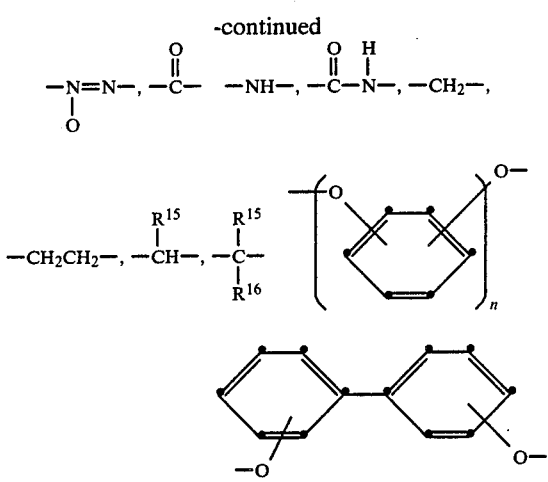

in which $R^{15}$, $R^{16}$ and $R^{17}$ are alkyl having 1 to 6 C atoms, phenyl or benzyl, and $R^{16}$ and $R^{17}$ are alkoxy having 1 to 6 C atoms, phenoxy or benzyloxy.

In each of the formulae first mentioned, two of the free bonds are always in the peri-position and/or ortho-position.

A preferred subgroup for Q is formed by radicals of the formula

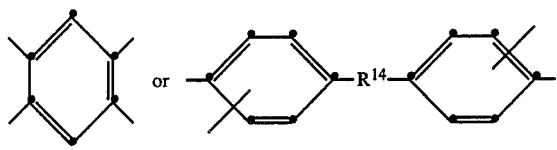

in which $R^{14}$ is a direct bond, —O—, —SO$_2$—, —CH$_2$— and particularly —CO—.

The most preferred radicals are those of the formulae

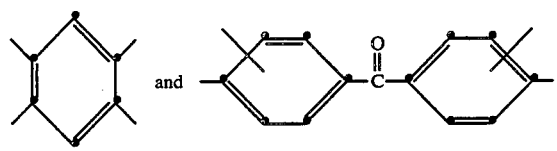

or mixtures thereof, for example those containing at least 5 mole % of tetravalent benzophenone radicals. The free bonds in the benzophenone radical are in the ortho-position.

The following are examples of tetracarboxylic anhydrides containing a radical Q: 2,3,9,10-perylenetetracarboxylic dianhydride, 1,4,5,8-naphthalenetetracarboxylic dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyromellitic dianhydride, 3,3',4,4'-biphenyltetracarboxylic dianhydride, 2,2',3,3'-biphenyltetracarboxylic dianhydride, 4,4'-isopropylidenediphthalic anhydride, 3,3'-isopropylidenediphthalic anhydride, 4,4'-oxydiphthalic anhydride, 4,4'-sulfonyldiphthalic anhydride, 3,3'-oxydiphtthalic anhydride, 4,4'-methylenediphthalic anhydride, 4,4'-thiodiphthalic anhydride, 4,4'-ethylidenediphthalic anhydride, 2,3,6,7-naphthalenetetracarboxylic dianhydride, 1,2,4,5-naphthalenetetracarboxylic dianhydride, 1,2,5,6-naphthalenetetracarboxylic dianhydride, benzene-1,2,3,4-tetracarboxylic dianhydride, thiophene-2,3,4,5-tetracarboxylic dianhydride, 1-(3',4'-dicarboxyphenyl)-1,3,3-trimethylindane-5,6-dicarboxylic dianhydride, 1-(3',4'-dicarboxyphenyl)-1,3,3-trimethylindane-6,7-dicarboxylic dianhydride, 1-(3',4'-dicarboxyphenyl)-3-methylindane-5,6-dicarboxylic dianhydride, 1-(3',4'-dicarboxyphenyl)-3-methylindane-6,7-dicarboxylic dianhydride, 3,3',4,4'-benzophenonetetracarboxylic anhydride and 4,5,3',4-benzophenonetetracarboxylic anhydride.

As an aromatic radical, R in the polyimides is preferably a divalent, mononuclear or dinuclear phenylene radical. As linear or branched alkyl and alkoxy, the substituents of R can contain 1 to 20, preferably 1 to 6 and especially 1 to 4, C atoms, as linear or branched alkoxyalkyl they can contain 2 to 12, particularly 2 to 6, C atoms, as alkylene they can contain 3 or 4 C atoms, as cycloalkyl they can contain 5 to 8, particularly 5 or 6, ring carbon atoms, and as aralkyl they can contain 7 to 12 C atoms. Alkoxyalkyl is preferably alkoxymethyl and aralkyl is preferably benzyl.

The following are examples of substituents: methyl, ethyl, propyl, isopropyl, n-butyl, isobutyl, tert.-butyl, pentyl, hexyl, octyl, dodecyl, tetradecyl, eicosyl, cyclopentyl, cyclohexyl, methylcyclohexyl, methoxy, ethoxy, propoxy, butoxy, pentoxy, hexoxy, methoxymethyl, methoxyethyl, ethoxymethyl, propoxymethyl, butoxymethyl, benzyl, methylbenzyl and phenylethyl. Preferred radicals are methoxymethyl, ethoxymethyl, methyl, ethyl, isopropyl, trimethylene and tetramethylene. Isopropyl, ethyl and especially methyl are particularly preferred.

As a substituted aromatic radical, R can contain 8 to 30, particularly 8 to 25, C atoms. The aromatic radical is preferably a pyridine radical and particularly a hydrocarbon radical which is substituted by alkyl, alkoxyalkyl, alkoxy, trimethylene or tetramethylene. The aromatic radical can contain further substituents, for example a halide, such as Cl or Br. In a preferred subgroup, the aromatic radicals are phenylene radicals as mononuclear radicals and are naphthylene or biphenylylene as dinulcear radicals.

A preferred subgroup of polyimides according to the invention is formed by those in which R, as an aromatic radical, has the formula IV, IVa and/or IVb

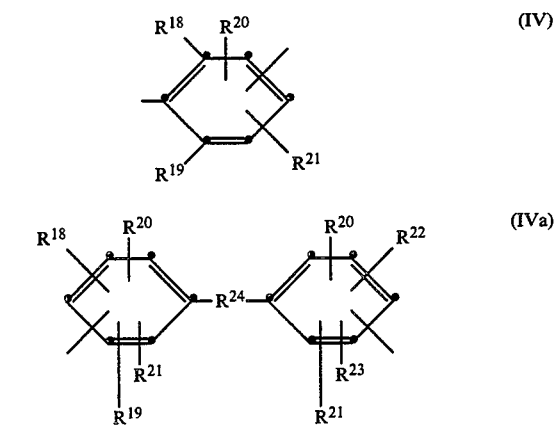

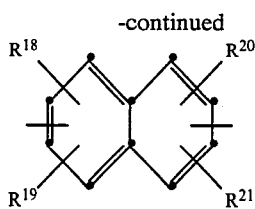
(IVb)

in which, in formula IV the free bonds are in the meta-position or para-position relative to one another, in formula IVa the free bonds are preferably in the meta-position or para-position relative to the $R^{24}$ group, and $R^{18}$ and $R^{19}$ are attached in the two positions ortho relative to the free bond, and in formula IVb the free bonds are attached in the 2-, 3-, 6- and 7-positions, and $R^{18}$ and $R^{19}$ are in the two positions ortho relative to the free bond, $R^{24}$ is a direct bond, —O—, —S—, —SS—, —SO—, —SO$_2$—, —CO—, —COO—, —NH—, —N—alkyl having 1 to 6 C atoms in the alkyl, —N-phenyl, —N-benzyl, —CONH—, —CON-alkyl— having 1 to 6 C atoms in the alkyl, —CON-phenyl-, —CON-benzyl-,

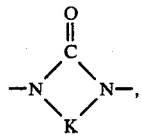

in which K is

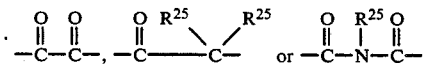

and $R^{25}$ is a hydrogen atom, $C_1$-$C_6$-alkyl or phenyl, linear or branched alkylene having 1 to 3 C atoms, alkylidene which has 2 to 12 C atoms and is unsubstituted or substituted by Cl or F, cycloalkylidene having 5 or 6 ring carbon atoms, phenylene, phenylenedioxy or the group

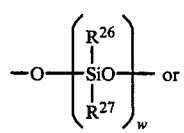

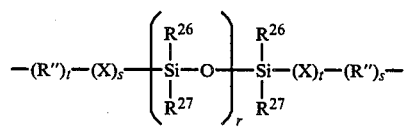

in which $R^{26}$ and $R^{27}$ are alkyl or alkoxy having 1 to 6 C atoms, phenyl, benzyl, phenoxy or benzyloxy, r is a number from 1 to 10, t is 0 or 1 and s is 0 or 1, and R" is —O— or —S—, and X is $C_1$-$C_6$-alkylene, and w is a number from 1 to 100, $R^{18}$ and $R^{19}$ are alkyl, or alkoxy having 1 to 12 C atoms, alkoxyalkyl having 2 to 12 C atoms, cyclopentyl, cyclohexyl or benzyl, or, in the formula IV or IVa $R^{18}$ and $R^{20}$ are attached in adjacent positions and together are trimethylene or tetramethylene, it being also possible for $R^{19}$ to be a hydrogen atom, $R^{20}$ and $R^{21}$ are a hydrogen atom or independently are as defined for $R^{18}$ and $R^{19}$, and $R^{22}$ and $R^{23}$ are a hydrogen atom or independently are as defined for $R^{18}$ and $R^{19}$, or $R^{20}$ and $R^{22}$ in formula IVa together are trimethylene or tetramethylene. $R^{18}$ and $R^{19}$ are preferably alkyl having 1 to 6 C atoms, particularly methyl, ethyl, n-propyl and isopropyl. The free bonds of the formula IVa are preferably in the meta-position, particularly in the para-position, relative to the $R^{24}$ group. The alkyl group in the $R^{24}$ radicals can, for example, be methyl, ethyl, propyl, isopropyl, n-butyl or pentyl. As alkylene, $R^{24}$ is preferably ethylene, particularly methylene. As alkylidene, $R^{24}$ preferably contains 2 to 6 C atoms. Examples are ethylidene, 2,2-butylidene, 2,2-pentylidene, 3,3-pentylidene, hexafluoropropylidene and especially 2,2-propylidene. As cycloalkylidene, $R^{24}$ can, for example, be cyclopentylidene, particularly cyclohexylidene. The $R^{24}$ group is preferably a direct bond, —O—, —S—, —SO$_2$—, —CO—, alkylene and alkylidene. $R^{24}$ is particularly preferentially a direct bond, —O—, and, in particular, —CO— or —CH$_2$—. $R^{26}$ and $R^{27}$ are preferably alkyl, particularly methyl, or phenyl. R" is preferably —O—, and X is preferably methylene or ethylene, w is preferably a number from 1 to 10 and r is preferably a number from 1–20, especially 1 to 10.

A further group of diamino radicals is formed by those of the formula

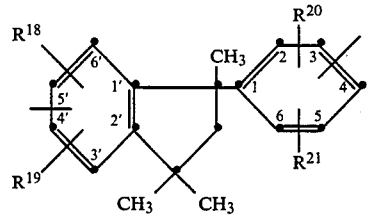

in which the first free bond is attached in the 4'-position or 5'-position and the other free bond is attached in the 3-position, 5-position and, preferably, the 4-position, and $R^{18}$ and $R^{19}$ and/or $R^{20}$ and $R^{21}$ are in the positions ortho relative to the free bond and are alkyl or alkoxy having 1 to 12 C atoms or alkoxyalkyl having 2 to 12 C atoms.

A particularly preferred subgroup of polyimides according to the invention is formed by those in which R in formulae I and/or II is a radical of the formulae

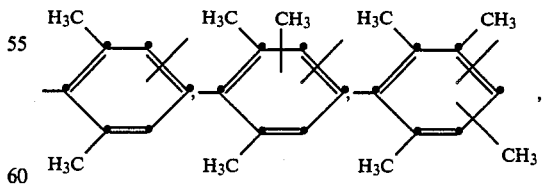

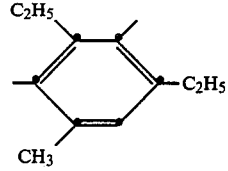

in which the free bonds are in the meta-position or para-position relative to one another, or a radical of the formula

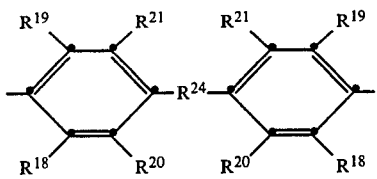

in which $R^{18}$ and $R^{19}$ independently are methyl, ethyl, n-propyl or isopropyl and $R^{20}$ and $R^{21}$ are a hydrogen atom or are as defined for $R^{18}$, or $R^{18}$ and $R^{20}$ together are trimethylene or tetramethylene, and $R^{19}$ and $R^{21}$ are a hydrogen atom, and $R^{24}$ is a direct bond, $CH_2$, 2,2-propylidene or CO. The most preferred dinuclear radicals are those in which $R^{18}$, $R^{19}$, $R^{20}$ and $R^{21}$ are methyl. Copolyimides containing at least 2 different radicals of these formulae are a further preferred embodiment of the invention.

Copolyimides according to the invention contain at least two different structural elements, the number of different structural elements depending essentially on the properties desired and the field of application. They preferably contain 2 to 4 different structural elements, it being possible for the structural elements to differ only in the radical R of the formulae I and/or II. Structural elements of ortho-disubstituted phenylenes, particularly 1,3-phenylenes, are present in a particularly preferred embodiment of such copolyimides.

The following are examples of R in polyimides according to the invention: 2,6-dimethyl-1,4-phenylene, 2,6-dimethyl-1,3-phenylene, 2,6-diethyl-1,4-phenylene, 2,6-diethyl-1,3-phenylene, 2,6-dimethyl-5-chloro-1,4-phenylene, 2,6-dimethyl-5-chloro-1,3-phenylene, 2-methyl-6-ethyl-1,4-phenylene, 2-methyl-6-ethyl-1,3-phenylene, 2-methyl-6-isopropyl-1,4-phenylene, 2-methyl-6-isopropyl-1,3-phenylene, 2,6-diisopropyl-1,4-phenylene, 2,6-diisopropyl-1,3-phenylene, 2,6-dimethoxy-1,4-phenylene, 2,6-dimethoxy-1,3-phenylene, 2,6-diethoxy-1,4-phenylene, 2,6-diethoxy-1,3-phenylene, 2-methyl-6-methoxy-1,4-phenylene, 2-methyl-6-methoxy-1,3-phenylene, 2,6-dibenzyl-1,4-phenylene, 2,6-dibenzyl-1,3-phenylene, 2,6-dimethoxymethyl-1,4-phenylene, 2,6-dimethoxymethyl-1,3-phenylene, 2,5,6-trimethyl-1,4-phenylene, 2,5,6-trimethyl-1,3-phenylene, 2,5,6-triethyl-1,4-phenylene, 2,5,6-triethyl-1,3-phenylene, 2,4,6-trimethyl-1,3-phenylene, 2,3,5,6-tetramethyl-1,4-phenylene, 2,4,5,6-tetramethyl-1,3-phenylene, tetrahydro-1,4-naphthylene or tetrahydro-1,3-naphthylene, radicals of the formulae

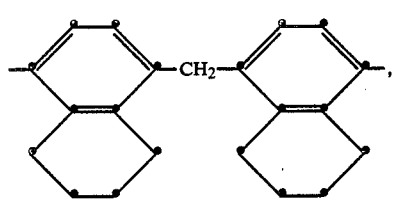

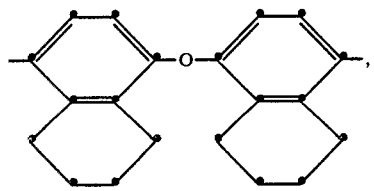

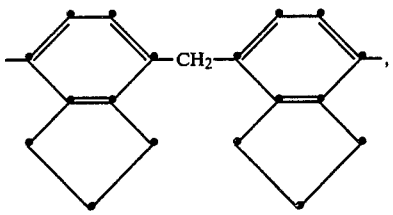

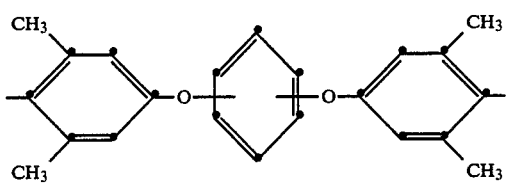

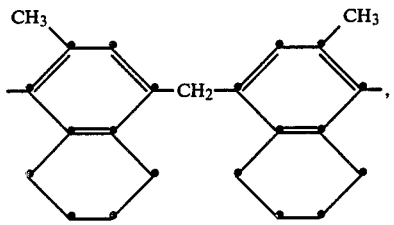

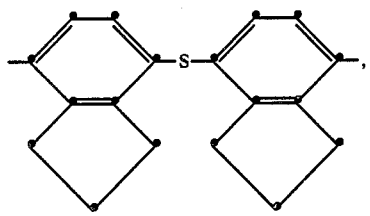

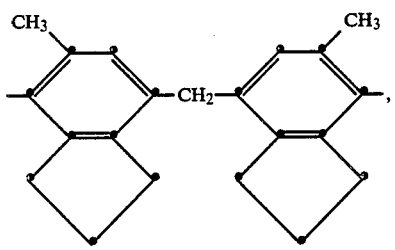

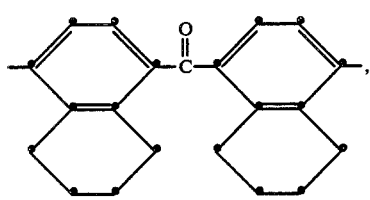

-continued

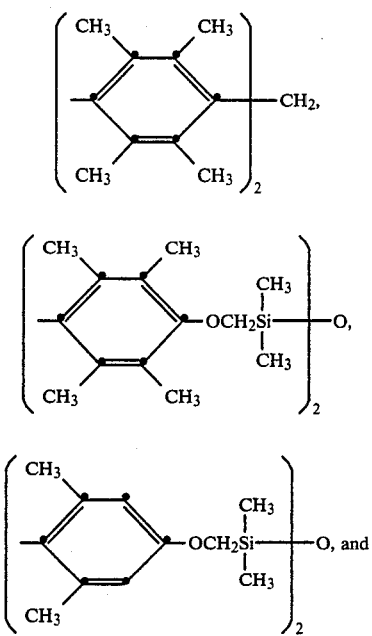

-continued

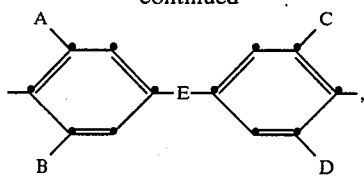

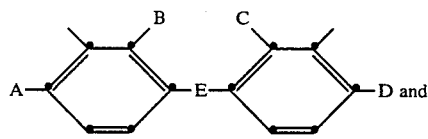

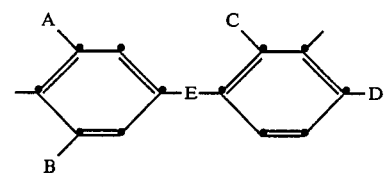

in which A, B, C, D and E are as defined in the table below. In these radicals, the free positions in the phenyl nuclei can be occupied by one or two further substituents G or H in each nucleus, it being possible for G or H to be as defined for A to D in the table below:

| E | A | B | C | D |
|---|---|---|---|---|
| CH₂ | Methyl | Methyl | H | H |
| CH₂ | Methyl | Ethyl | H | H |
| CH₂ | Ethyl | Ethyl | H | H |
| CH₂ | Isopropyl | Isopropyl | H | H |
| CH₂ | Methoxymethyl | Methoxymethyl | H | H |
| CH₂ | Benzyl | Benzyl | H | H |
| CH₂ | Methyl | Methyl | Methyl | H |
| CH₂ | Ethyl | Ethyl | Ethyl | H |
| CH₂ | Isopropyl | Isopropyl | Methyl | Methyl |
| CH₂ | Methoxymethyl | Methoxymethyl | Methyl | H |
| CH₂ | Methyl | Ethyl | Methyl | H |
| CH₂ | Methoxymethyl | Methoxymethyl | Methoxymethyl | Methoxymethyl |
| CH₂ | Methyl | Methyl | Methyl | Methyl |
| CH₂ | Ethyl | Ethyl | Ethyl | Ethyl |
| CH₂ | Methyl | Methyl | Ethyl | Ethyl |
| CH₂ | Ethyl | Ethyl | Isopropyl | Isopropyl |
| CH₂ | Isopropyl | Isopropyl | Isopropyl | Isopropyl |
| CH₂ | Isopropyl | Isopropyl | Methyl | H |
| CH₂ | Methoxy | Methoxy | Methyl | Methyl |
| O | Methyl | Methyl | H | H |
| O | Ethyl | Ethyl | H | H |
| O | Methyl | Methyl | Methyl | H |
| O | Methyl | Methyl | Methyl | Methyl |
| O | Methyl | Methyl | Ethyl | Ethyl |
| S | Methyl | Methyl | H | H |
| S | Ethyl | Ethyl | H | H |
| S | Methyl | Methyl | H | H |
| S | Methyl | Methyl | Methyl | Methyl |
| S | Ethyl | Ethyl | Ethyl | Ethyl |
| S | Methyl | Methyl | Ethyl | Ethyl |
| CO | Methyl | Methyl | Methyl | H |
| CO | Methyl | Methyl | H | H |
| CO | Methyl | Methyl | Methyl | Methyl |
| SO₂ | Methyl | Methyl | Ethyl | H |
| SO₂ | Methyl | Methyl | H | H |
| SO₂ | Methyl | Methyl | Methyl | Methyl |
| SO₂ | Ethyl | Ethyl | Methyl | Methyl |
| SO | Methyl | Methyl | Methyl | Methyl |
| SO | Methyl | Methyl | H | H |
| COO | Methyl | Methyl | H | H |
| COO | Methyl | Methyl | Methyl | Methyl |
| CONCH₃ | Methyl | Methyl | H | H |
| NCH₃ | Methyl | Methyl | Ethyl | Ethyl |
| NCH₃ | Methyl | Methyl | Methyl | Methyl |
| CONH | Methyl | Methyl | — | — |
| NH | | Methyl | Ethyl | Methyl |
| NH | Methyl | Methyl | Methyl | Methyl |

| E | A | B | C | D |
|---|---|---|---|---|
| Si(Methyl)$_2$ | Methyl | Methyl | H | H |
| Si(Phenyl)$_2$ | Methyl | Methyl | Methyl | Methyl |
| Si(OMethyl)$_2$ | Ethyl | Ethyl | H | H |
| Si(OPhenyl)$_2$ | Methyl | Methyl | Methyl | Methyl |
| —OSi(Methyl)$_2$O— | Methyl | Methyl | Methyl | Methyl |
| Ethylene | Methly | Methyl | H | H |
| Ethylene | Methyl | Methyl | Methyl | Methyl |
| Ethylene | Ethyl | Ethyl | H | H |
| Ethylene | Methyl | Methyl | Ethyl | Ethyl |
| Phenylene | Methyl | Methyl | Methyl | Methyl |
| Phenylene | Ethyl | Ethyl | H | H |
| (CH$_3$)$_2$C< | Methyl | Ethyl | Methyl | Ethyl |
| (CH$_3$)$_2$C< | Methyl | Methyl | Methyl | Methyl |
| (CF$_3$)$_2$C< | Methyl | Methyl | Methyl | Methyl |
| Direct bond | Methyl | Methyl | H | H |
| Direct bond | Methyl | Ethyl | Methyl | |
| Direct bond | Methyl | Ethyl | Methyl | H |
| Direct bond | Ethyl | Ethyl | Ethyl | Ethyl |
| Direct bond | Methoxy | Methoxy | Methoxy | Methoxy |
| Direct bond | Isopropyl | Isopropyl | H | H |
| Direct bond | Methoxymethyl | Methoxymethyl | Methoxymethyl | Methoxymethyl |

Diamines from which R is derived are known or can be prepared by known processes. Diamines containing Si are described in U.S. Pat. No. 3,435,002 and EP A-0,054,426. Diamines containing the

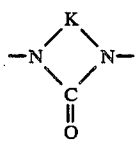

group can be prepared from the diisocyanates described in DE A-2,318,170. Diamines substituted by alkyl or cycloalkyl, particularly by ethyl or propyl, are accessible by alkylating unsubstituted or partly substituted aromatic diamines by means of alkenes or cycloalkenes (cf. U.S. Pat. No. 3,275,690). Polynuclear, particularly dinuclear, aromatic diamines can be obtained via a condensation reaction between corresponding monoamines and aldehydes or ketones.

$R^{13}$ can correspond to the radicals R described above, the aromatic radicals not being substituted in the two o-positions relative to the N atom.

In one embodiment, $R^{13}$ has the formula V

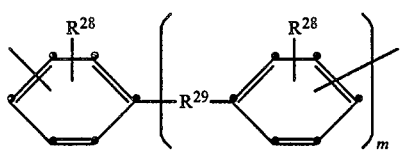

in which m is 0 or 1, the free bonds are attached in the meta-position, preferably in the paraposition, relative to the $R^{29}$ group, $R^{29}$ is as defined for $R^{24}$ in formula IVa and $R^{28}$ is as defined for $R^{18}$.

A preferred subgroup is formed by arylene radicals of the formula Va, Vb or Vc

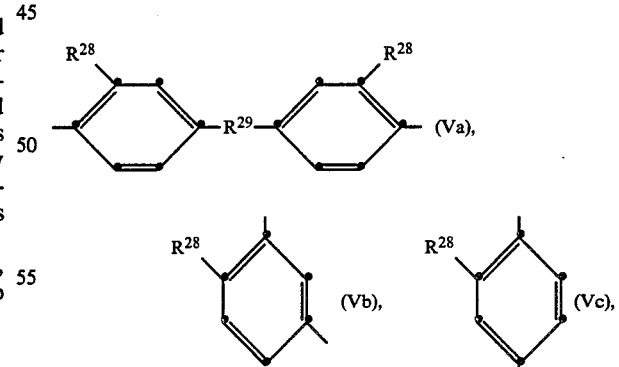

in which $R^{29}$ is a direct bond, —O—, —CO— or —CH$_2$—, and $R^{28}$ is methyl, ethyl, isopropyl, methoxy, ethoxy or a hydrogen atom.

In a particularly preferred embodiment, polyimides according to the invention consist of recurring structural elements of the formulae

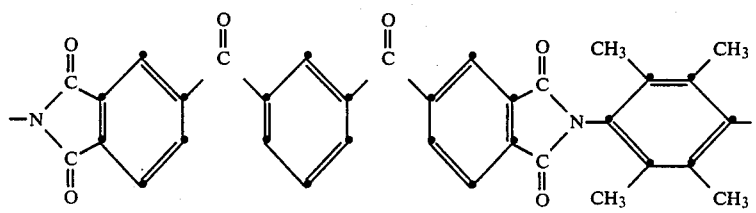

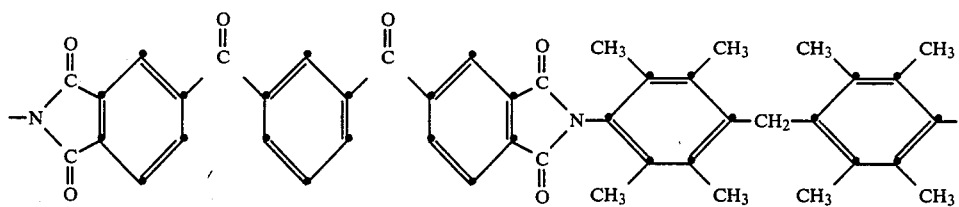

or mixtures of these structural elements.

The preparation of the homopolyimides and copolyimides is effected in a customary manner by reacting a tetracarboxylic anhydride with diamines of the formula $NH_2RNH_2$, if appropriate together with further tetracarboxylic anhydrides of the formula

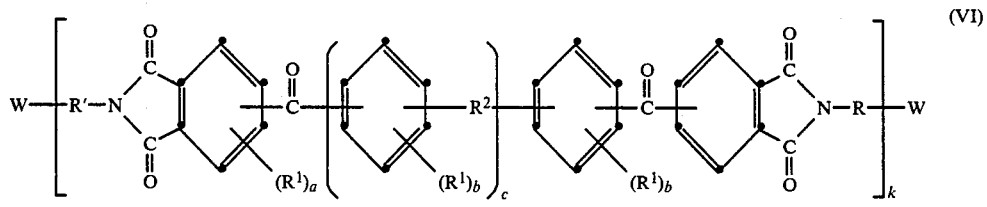

(VI)

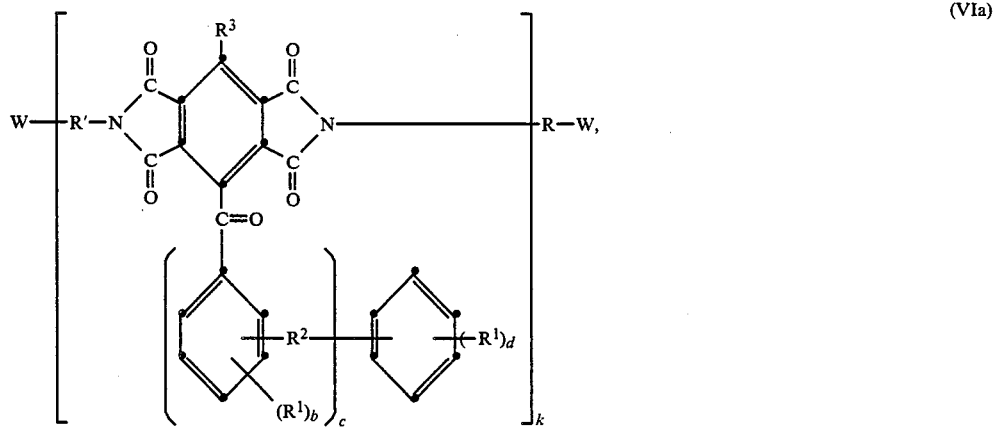

(VIa)

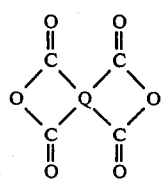

and/or further diamines of the formula $NH_2R^{13}NH_2$, and subsequent imide cyclisation under the action of carboxylic anhydrides and/or subsequent heating. In a further known process, diisocyanates are reacted with tetracarboxylic dianhydrides to give polyimides in one step. As mentioned initially, those containing the structural elements of the formulae I and Ia are known or can be prepared by analogous processes which have been described.

The starting materials used for the preparation of the other selected homopolymers and copolymers are functional imide derivatives of tetracarboxylic acids. They can have the formula VI or VIa in which R, R', $R^1$–$R^3$ and a–d are as defined above, k is a number from 1 to about 500 and W is a functional group. The following are possible examples of such functional groups: $NHR^{38}$, OH, SH, O-acyl, $COOR^{38}$, $CON(R^{38})_2$, COCl, COBr,

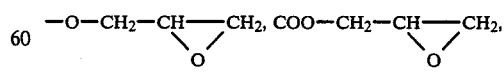

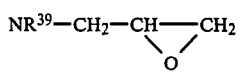

and halogen, particularly Cl and Br. $R^{38}$ is a hydrogen atom or a free or hydroxylated hydrocarbon radical, for example alkyl or hydroxyalkyl preferably having 1–20, particularly 1–12, C atoms, aralkyl preferably having 7–20, particularly 7–16, C atoms, aryl preferably having 6–20, particularly 6–16, C atoms or cycloalkyl preferably having 5–7 ring C atoms. $R^{39}$ can be as defined for $R^{38}$ or can be

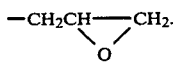

The acyl group can contain 1 to 20, preferably 1–12, C atoms. In the formulae VI and VIa R' is preferably as defined for R.

The compounds of the formulae VI and VIa are novel and also form a subject of the invention. These are oligomeric and low-molecular polyimides containing functional end groups. They are obtained by processes analogous to those used for polyimides, the magnitude of k being determined by the amount of monomers of the formula ω—R—NH$_2$ which are employed in conjunction. These monomers (c=1), oligomers and low-molecular polymers afford, for example, block polymers containing polyimide blocks attached via, for example, ester, amide or imide groups.

A further preferred group of polymers according to the invention is formed by a polyamide or copolyamide composed of organic diamines, dicarboxylic acids, ω-aminocarboxylic acids and diamines or dicarboxylic acids containing structural elements of the formulae I and/or II in which q is 1 and in which amine groups or carboxyl groups are attached to the R and R' groups, and also composed of mixtures of the monomers.

The homopolymers can be homopolymers in which the molecular chains are built up from dicarboxylic acids and diamines of the formulae VI and/or VIa, or homopolymers in which the molecular chains are built up from dicarboxylic acids or diamines of the formulae VI and/or VIa and other organic diamines or dicarboxylic acids, respectively. Copolyamides can contain further diamine or dicarboxylic acid radicals or aminocarboxylic acid radicals.

Examples of suitable dicarboxylic acids are linear or branched aliphatic dicarboxylic acids preferably having 2 to 20, particularly 4 to 16, C atoms, cycloaliphatic dicarboxylic acids which are unsubstituted or substituted by, in particular, alkyl and which have 5 to 7 ring C atoms, and aromatic dicarboxylic acids which are unsubstituted or substituted, for example, by alkyl, Cl or bromine, and which preferably have 8 to 22 C atoms. The following are examples: malonic acid, adipic acid, trimethyladipic acid, pimelic acid, suberic acid, azelaic acid, dodecanedicarboxylic acid, cyclohexanedicarboxylic acids, isophthalic acid, terephthalic acid, p-biphenyldicarboxylic acid, bis-(4-carboxyphenyl)ether or bis-(4-carboxyphenyl)sulfone.

Examples of suitable diamines are linear or branched aliphatic diamines preferably having 2 to 30, in particular 4 to 20, C atoms, cycloaliphatic diamines which are unsubstituted or substituted by alkyl, particularly methyl, and which preferably have 5 to 7 ring C atoms, araliphatic diamines preferably having 7 to 24 C atoms and aromatic diamines which have 6 to 22, preferably 6 to 18, C atoms and which can be unsubstituted or substituted, particularly by alkyl. The following are examples: ethylenediamine, propylenediamine, 1,3-butylenediamine, 1,4-butylenediamine, pentylenediamine, 1,6-hexylenediamine, octylenediamine, decylenediamine, dodecylenediamine, 1,10-decylenediamines which are substituted by 1,10-alkyl, for instance 1,10-dimethyl-1,10-decylenediamine or 1,10-di-n-hexyl-1,10-decylenediamine, xylylenediamine, isophoronediamine, 1,3-cyclohexanediamine, 1,4-cyclohexanediamine, 1,3-phenylenediamine, 1,4-phenylenediamine, methylphenylenediamine, toluylenediamine, p-biphenylylenediamine, bis-(p-aminophenyl)ether, bis-(p-aminophenyl)sulfone or bis-(p-aminophenyl)methane.

The aminocarboxylic acids can be aromatic, cycloaliphatic or aliphatic aminocarboxylic acids, for example aminobenzoic acid, aminocyclohexanecarboxylic acid and ω-aminocarboxylic acids, such as ε-aminocaproic acid or 11-aminoundecanoic acid.

A further preferred group of polymers according to the invention is formed by a polyester or copolyester composed of organic diols, dicarboxylic acids, hydroxycarboxylic acids and diols or dicarboxylic acids containing structural elements of the formulae I and/or II in which q is 1 and in which hydroxyl or carboxyl groups are attached to the R and R' groups, and also composed of mixtures of the monomers.

The homopolyesters can be homopolyesters in which the molecular chains are built up from diols and dicarboxylic acids of the formulae VI or VIa, or homopolyesters in which the molecular chains are built up from dicarboxylic acids or diols of the formulae VI or VIa and other organic diols or dicarboxylic acids, respectively. The copolyesters contain further radicals of dicarboxylic acids, diols and/or hydroxycarboxylic acids.

Suitable dicarboxylic acids have been mentioned above. Polyesters based on aromatic dicarboxylic acids, particularly terephthalic acid and/or isophthalic acid, are preferred. Suitable diols are cycloaliphatic diols, such as 1,4-cyclohexanediol, aromatic diols, such as bisphenol A, and particularly aliphatic diols which are substituted or unsubstituted, such as branched, and especially linear, alkylenediols having, for example, 2 to 12, preferably 2 to 6, C atoms, and also 1,4-bishydroxymethylcyclohexane and neopentylglycol hydroxypivalate. Ethylene glycol, trimethylene glycol, tetramethylene glycol and hexamethylene glycol are particularly preferred. Examples of suitable hydroxycarboxylic acids are m-hydroxybenzoic or p-hydroxybenzoic acid or aliphatic ω-hydroxycarboxylic acids, for example γ-hydroxyvaleric acid, hydroxypivalic acid and ε-caprolactone.

In a further preferred embodiment, the polymers according to the invention are a polyamide-imide or a polyester-imide. Such polymers can be obtained by incorporating tricarboxylic acids of the formula VII or polymerforming derivatives thereof, such as an ester, anhydride or acid halide:

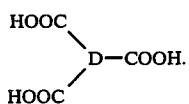

The trivalent radical can be a hydrocarbon radical which preferably has 6 to 16 C atoms and in which two carboxyl groups are attached to two adjacent C atoms. Trimellitic acid is preferred.

The polyamide-imides can be built up merely from diamines of the formulae VI or VIa and tricarboxylic acids of the formula VII. Copolymers are obtained if, in addition, dicarboxylic acids and/or diamines, for example those mentioned above for the polyamides, are also used in the preparation of the polyamide-imides.

Polyester-imides can be obtained if an aminocarboxylic acid or an aminoalcohol is first reacted with tricarboxylic acids of the formula VII to give dicarboxylic acids or hydroxycarboxylic acids, respectively, and if these are then subjected to further polycondensation with diols and/or dicarboxylic acids of the formulae VI and/or VIa to give polyesters. Here, too, further dicarboxylic acids and/or diols can additionally be used for the preparation of copolymers.

Polyester-amides are also preferred. These polymers are obtained if dicarboxylic acids of the formula VI or VIa and/or further dicarboxylic acids are subjected to polycondensation with diols of the formula VI or VIa and/or other diols and diamines of the formulae VI and/or VIa and/or other diamines; the individual monomers have already been mentioned above.

The N atoms of the amide groups in the polymers mentioned above can be substituted by alkyl preferably having 1 to 6 C atoms, aryl, for example phenyl, aralkyl, for example benzyl, or cycloalkyl, for example cyclohexyl.

The following are examples of further polymers according to the invention:

(a) polysiloxanes formed from diols of the formulae VI and/or VIa and, if appropriate, further diols and silanes of the formula $(R^{40})_2SiB_2$ in which $R^{40}$ is preferably alkyl having 1 to 6 C atoms, particularly methyl, and aryl, particularly phenyl, and B is Br, and particularly Cl, or alkoxy and also aryloxy preferably having 1 to 6 C atoms, particularly methoxy or phenoxy. These polymers can thus contain structural elements of the formula

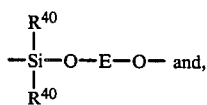

if appropriate, of the formula

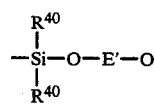

n which E corresponds to the radical of the formulae I and/or II in which q is 1, and E' is the divalent radical of a diol. Suitable diols HOE'OH have already been mentioned above. These polymers can also contain additional blocks containing structural elements of the formula

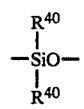

and these blocks can constitute up to 50 mole %, relative to the polymer.

(b) Unsaturated polyesters formed from unsaturated dicarboxylic acids, particularly maleic acid, and diols of the formulae I and/or II (HOEOH) and, if appropriate, further dicarboxylic acids, also of the formulae I and/or II, and further diols HOE'OH. Suitable dicarboxylic acids have already been mentioned above. These polymers can thus contain structural elements of the formula

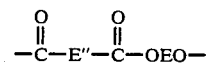

in which E" is the divalent radical of an ethylenically unsaturated dicarboxylic acid. Further structural elements which can be present are

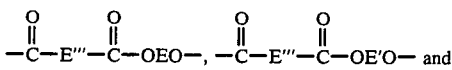

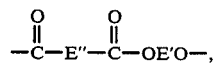

in which E''' is the divalent radical of a dicarboxylic acid of the formulae I and/or II or of another dicarboxylic acid.

As a result of the presence of the ethylenically unsaturated groups, these polymers can also be polymerised by heat in the presence of customary polymerisation catalysts, if desired together with reactive thinners, such as styrene.

(c) Suitable epoxide resins can be obtained in various ways. Thus the epoxide compounds of the formula VI or VIa can be reacted on their own or together with further polyepoxide compounds containing more than one epoxide group in the molecule by catalysis, for example by means of tertiary amines, to give polyethers, or they can be reacted with customary curing agents, such as polyols, preferably polyphenols, polycarboxylic acids and anhydrides thereof or polyamines. The diamines, diols and dicarboxylic acids of the formulae VI and VIa can also be used as curing agents, in which case customary polyepoxide compounds alone can be employed. The epoxide resins can be used as prepolymers which can be cured by heat after the irradiation.

(d) Aromatic polyethers can be obtained, for example, by reacting compounds of the formulae VI and/or VIa in which W is OH or halogen, particularly Br or Cl, and R and R' are an aromatic radical, with phenyl-aromatic dichlorides or bromides or diols, respectively. Examples of suitable halides or diols are mononuclear or dinuclear phenyl-aromatic derivatives, such as hydroquinone, p-dichlorophenylene, p-dibromophenylene, p-dihydroxyphenylene, p-dichlorobiphenylylene, p-dibromobiphenylylene, bis-(p-hydroxyphenyl)ether and bis-(p-chlorophenyl)ether.

The phenyl-aromatic radicals can contain further substituents, for example alkyl preferably having 1 to 4 C atoms. Polyether-sulfones are obtained if dinuclear phenyl-aromatic radicals in which the phenyl groups are attached to a sulfone group are used. Examples of such derivatives are bis-(p-chlorophenyl)sulfone and bis-(p-hydroxyphenyl)sulfone. Polyethers containing only structural elements of the formulae I and/or II are obtained from compounds of the formulae VI and/or VIa in which W is OH, by means of compounds of the formula VI or VIa in which W is halogen.

(e) Aromatic polyketones can be obtained by reacting aromatic compounds of the formulae VI and/or VIa in which W is H, in the presence of Lewis acids, with aromatic acid halides of the formulae VI and/or VIa in which W is an acid halide group, particularly an acid chloride group. Further aromatic, particularly phenyl-aromatic, compounds and/or aromatic, particularly phenyl-aromatic, dicarboxylic acid dihalides can also be used in addition. The aromatic compounds are preferably mononuclear or dinuclear phenyl-aromatic compounds or dicarboxylic acid dihalide derivatives thereof. Examples are benzene, toluene, biphenyl, diphenylmethane, diphenyl ketone, diphenyl sulfone, diphenyl ether, terephthaloyl dichloride, 4,4'-chlorocarbonyl biphenyl, 4,4'-chlorocarbonyldiphenylmethane, 4,4'-chlorocarbonyldiphenyl ether or 4,4'-chlorocarbonyldiphenyl sulfone. Polyether-ketones are obtained if the ether derivatives are used. The aromatic hydrocarbons or dicarboxylic acid dihalides can be substituted, for example by alkyl having 1 to 4 C atoms.

(f) Aromatic polythioethers can be obtained, for example, by reacting aromatic compounds of the formulae VI and/or VIa in which W is halogen, such as Cl and especially Br, with di-alkali metal sulfides, for example $Na_2S$. It is also possible to use other aromatic, particularly phenyl-aromatic, dihalogen compounds, preferably chlorides and particularly bromides, as well. Aromatic polysulfides can also be obtained by reacting aromatic compounds of the formulae VI and/or VIa in which W is SH, on their own or together with other dimercaptans, particularly phenyl-aromatic dimercaptans, or particularly the alkali metal salts thereof, for example the sodium salts, with compounds of the formulae VI and/or VIa in which W is halogen, particularly Br, and/or other dihalides, especially phenyl-aromatic dihalides, for example bromides. Halides of this type have already been mentioned above. Examples of suitable aromatic dimercaptans are 1,4-phenylenedimercaptan or p-biphenylylenedimercaptan.

(g) Examples of further suitable polymers are those which can be obtained by reacting compounds of the formulae VI and/or VIa in which W is OH, $NH_2$ or COOH with diisocyanates or diepoxides.

(h) Aromatic polyimidazoles form a further group of suitable polymers. They can be obtained by reacting esters of the formulae VI and/or VIa, on their own or together with further aromatic dicarboxylic acid diesters, with aromatic tetramines, for example 3,3',4,4'-tetraaminobiphenyl, to give polyamide precursors, which are then subjected to condensation by heating to give the polyimidazoles.

The polymers according to the invention are soluble, if appropriate by warming, in various solvents, and the polyimides according to the invention exhibit increased glass transition temperatures which can be as high as 400° C. They are excellently suitable for the production of films and protective coatings, in which respect it is possible to use coating agents consisting of a solution of the polymers, preferably the polyimides in a solvent. The present invention also relates to a coating agent of this type, a material coated therewith and the use of the polymers according to the invention for the production of protective coatings. Coating agents and coated material also embrace the polyimides defined above in which q is O and R is aliphatic, cycloaliphatic or araliphatic radicals or coupled aromatic radicals and monosubstituted or polysubstituted aromatic radicals.

The coated material according to the invention is produced by appropriately dissolving the polymer or mixtures thereof in a suitable organic solvent, if necessary by heating. Examples of suitable solvents are polar, aprotic solvents, and these can be used on their own or as mixtures consisting of at least two solvents. The following are examples: ethers, such as dibutyl ether, tetrahydrofuran, dioxane, methylene glycol, dimethylethylene glycol, dimethyldiethylene glycol, diethyldiethylene glycol or dimethyltriethylene glycol, halogenated hydrocarbons such as methylene chloride, chloroform, 1,2-dichloroethane, 1,1,1-trichloroethane or 1,1,2,2-tetrachloroethane, carboxylic acid esters and lactones, such as ethyl acetate, methyl propionate, ethyl benzoate, 2-methoxyethyl acetate, γ-butyrolactone, δ-valerolactone and pivalolactone, carboxamides and lactams, such as formamide, acetamide, N-methylformamide, N,N-dimethylformamide, N,N-diethylformamide, N,N-dimethylacetamide, N,N-diethylacetamide, γ-butyrolactam, ε-caprolactam, N-methylpyrrolidone, N-acetylpyrrolidone, N-methylcaprolactam, tetramethylurea or hexamethylphosphoric acid amide, sulfoxides, such as dimethyl sulfoxide, sulfones, such as dimethyl sulfone, diethyl sulfone, trimethylene sulfone or tetramethylene sulfone, trimethylamine, triethylamine, N-methylpyrrolidine, N-methylpiperidine, N-methylmorpholine, substituted benzenes, such as chlorobenzene or nitrobenzene, or phenols or cresols.

Undissolved constituents can be removed by filtration, preferably pressure filtration. The concentration of polymer in the coating agent thus obtained is preferably not more than 50% by weight, particularly not more than 30% by weight and especially not more than 20% by weight, relative to the solution.

Further customary additives which do not have an adverse effect on the photosensitivity can be incorporated when the solutions are prepared. Examples of these are delustering agents, flow control agents, finely divided fillers, flame-retarding agents, fluorescent brighteners, antioxidants, light stabilisers, stabilisers, dyes, pigments, adhesion promoters and anti-halation dyes, such as are described, for example, in U.S. Pat. No. 4,349,619.

The coating agent can be applied to suitable substrates or base materials by customary methods, such as dipping, brushing and spraying processes, whirler-coating, cascade coating and curtain coating. Examples of suitable substrates are plastics, metals and metal alloys, semi-metals, semi-conductors, glass, ceramics and other inorganic materials, for example $SiO_2$ and $Si_3N_4$. The solvent is then removed, if appropriate, by heating and, if appropriate, in vacuo. Tack-free, dry and uniform films are obtained. Depending on the application, the films applied can have layer thicknesses up to approx. 500 μm or more, preferably 0.5 to 500 μm and particularly 1 to 50 μm.

It has been found that the polymers according to the invention are self-crosslinkable by light and can be cross-linked by the action of radiation.

Since the photosensitivity increases as the content of such structural elements increases, a content of at least 50 mole %, preferably at least 80 mole % and particularly at least 90 mole % is advantageous. The photosensitivity also depends on the molecular weight of the polymer.

Protective films composed of such polymers can be modified further by the action of radiation, whereby, for example, increased stability to heat is possible. It is also possible to employ such polymers as photographic recording material for relief images. As a result of the direct cross-linking under the influence of radiation, it is possible to avoid additives such as sensitisers, and the protective layers and images have excellent electrical properties. The protective layers and images are also distinguished by their high stability to heat and by having only a low shrinkage, or none at all, when exposed to heat, which has considerable advantages in use, because virtually no distortion of structures formed as images is observed. For this application the layer thickness is preferably 0.5 to 100 μm, particularly 1 to 50 μm and especially 1-10 μm.

The photo-texturising or photo-crosslinking can be induced by high-energy radiation, for example by light, particularly light within the UV range, and by X-rays, laser light, electron beams, etc. The material according to the invention is excellently suitable for the production of protective films and passivating lacquers and as a photographic recording material for heat-stable relief images.

Examples of end uses are protective, insulating and passivating lacquers in electrical engineering and electronics, photomasks for electronics, textile printing and the graphic trade, etch resists for the production of printed circuits and printing plates and integrated circuits, relays for the production of X-ray masks, as a solder resist, as a dielectric for multilayer circuits and as a structural element for liquid crystal display units.

The production of protective films is effected by direct exposure to light, the exposure times depending essentially on the layer thickness and the photosensitivity.

The photographic production of the relief structure is effected by imagewise exposure through a photomask, and subsequent developing by removing the unexposed portions by means of a solvent or mixture of solvents, after which, if appropriate, the image produced can be stabilised by subsequent heat treatment.

The invention also relates to a process of this type for the application of relief structures. Examples of suitable developers are the solvents mentioned above.

The polymer layer of the material according to the invention has a photosensitivity which is adequate for many end uses and is in some cases high, and it can be photocrosslinked directly. The protective films and relief images are distinguished by high adhesion and resistance to heat, mechanical stress and chemicals. Only a slight shrinkage is observed on subsequent heat treatment. It is also possible to avoid additives for producing or increasing photosensitivity. The material is stable on storage, but should advantageously be protected against the action of light.

The examples which follow illustrate the invention in greater detail. The viscosity is determined in a solution of 0.5 g of polymer in 100 ml of N-methylpyrrolidone at 25° C. The glass transition temperature is determined by differential scanning calorimetry (DSC).

The dianhydrides used in the examples have the structures A to D:

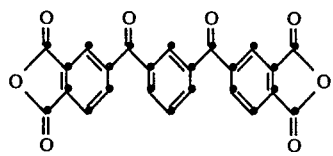
A

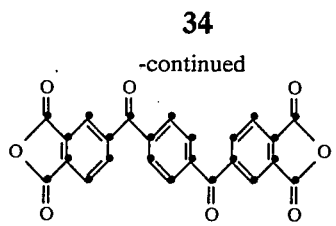
B

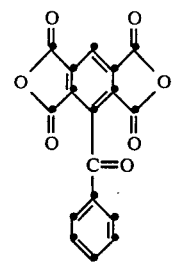
C

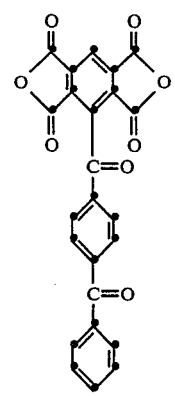
D

The preparation of A and B is described in French Patent Specification No. 1,601,094. The preparation of C is described in U.S. Pat. No. 3,299,101. D is prepared analogously to C.

(A) PREPARATION EXAMPLES cl EXAMPLE 1

1.642 g (0.01 mole) of 3,6-diaminodurene are dissolved in 25 ml of N-methylpyrrolidone (NMP) under nitrogen in a cylindrical vessel equipped with a stirrer, a dropping funnel, an internal thermometer and a gas inlet and outlet tube, and the solution is cooled to 5° to 0° C. 4.263 g of dianhydride of the formula A are then added, and the mixture is stirred for 1 hour. A further 2 portions, each of 0.0426 g of dianhydride, are added in the course of a further hour.

After 3 hours, 3.1 ml of triethylamine and 8.5 ml of acetic anhydride are added, and the mixture is stirred for 16 hours at room temperature, in the course of which the polyamide acid is cyclised to give the polyimide.

The polyimide is isolated by precipitation with 1 liter of water. The polymer is filtered off, treated with a further liter of water, filtered off again and dried at 80° C. in vacuo. The properties of the polyimide are shown in Table 1.

EXAMPLES 2 TO 20

Various diamines or mixtures of diamines are reacted analogously to Example 1 with dianhydrides of the formula A, B, C or D in NMP, and the products are cyclised to give the corresponding polyimides.

Table 1 shows the composition and properties:

TABLE 1
| Example | Dianhydride | Diamine | | η inh (dl/g) | Tg (°C.) |
|---|---|---|---|---|---|
| 1 | A | 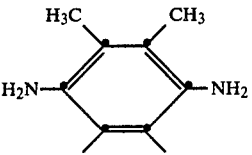 | | 0 543 | 336 |
| 2 | A | 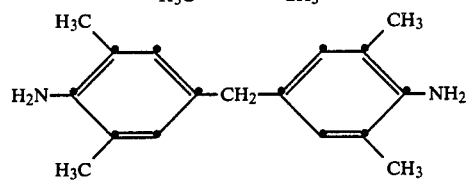 | | 0 515 | 290 |
| 3 | A | 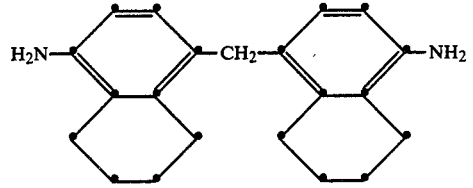 | | 0 568 | 292 |
| 4 | A | 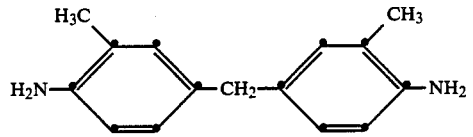 | | 0 571 | 258 |
| 5 | A | $H_2N-(CH_2)_{10}-NH_2$ | | 0 166 | 112 |
| 6 | A | 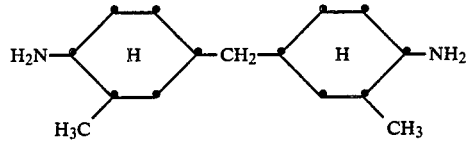 | | 0 428 | 255 |
| 7 | A | $H_2N-CH-(CH_2)_8-CH-NH_2$<br>$\quad\quad\;\, \overset{|}{C_6H_{13}} \quad\quad\quad\;\;\, \overset{|}{C_6H_{13}}$ | | 0 346 | 82 |
| 8 | A | 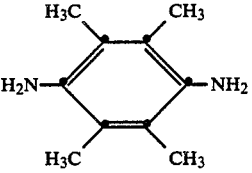 | | 0 218 | 90 |
| 9 | A | 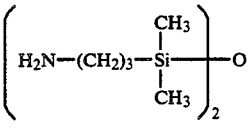 | 70 Mol-% | 0 310 | 252 |
|   |   | 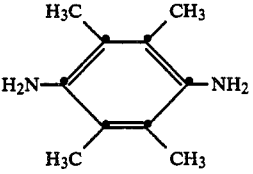 | 30 Mol-% |   |   |
| 10 | A | 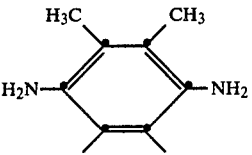 | 87.1 Mol-% | 0 234 | 326 |

TABLE 1-continued

| Example | Dianhydride | Diamine | | η inh (dl/g) | Tg (°C.) |
|---|---|---|---|---|---|
| | | H₂N—(CH₂)₃—Si(CH₃)₂—O—[Si(CH₃)₂—O]₃.₂—Si(CH₃)₂—(CH₂)₃—NH₂ | 12.9 Mol-% | | |
| 11 | A | tetramethyl-p-phenylenediamine (H₃C)₂C₆(NH₂)₂(CH₃)₂ | 70 Mol-% | 0 26 | 244 |
| | | [H₂N—C₆H₃(CH₃)—OCH₂—Si(CH₃)₂—]₂O | 30 Mol-% | | |
| 12 | A | [H₂N—C₆H₃(CH₃)—O—CH₂—Si(CH₃)₂—]₂O | | 0 17 | 142 |
| 13 | B | tetramethyl-p-phenylenediamine | | 0 52 | 384 |
| 14 | B | 2-methyl-p-phenylenediamine | | 0 33 | 263 |
| 15 | B | [H₂N—C₆H₂(CH₃)₂—]₂CH₂ (tetramethyl methylenedianiline) | 50 Mol-% | 0 47 | 289 |
| | | tetramethyl-p-phenylenediamine | 25 Mol-% | | |

TABLE 1-continued
| Example | Dianhydride | Diamine | | η inh (dl/g) | Tg (°C.) |
|---|---|---|---|---|---|
| | | 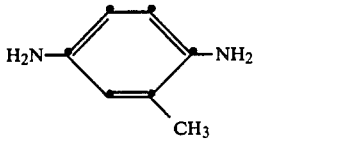 | 25 Mol-% | | |
| 16 | C | 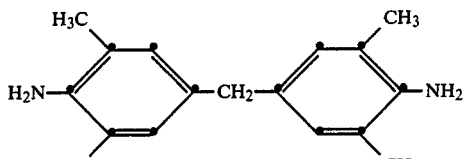 | | 0 306 | 333 |
| 17 | C | 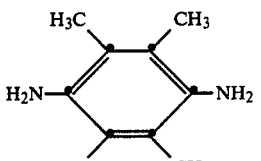 | 50 Mol-% | 0 393 | 321 |
| | | 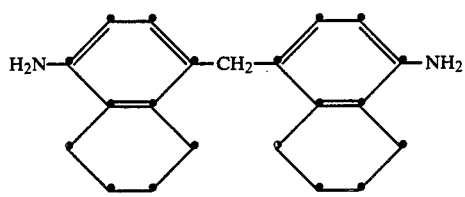 | 50 Mol-% | | |
| 18 | C | 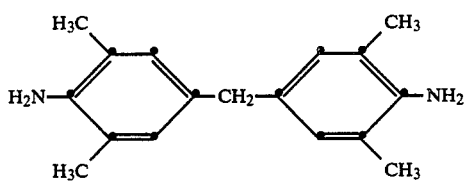 | | 0 528 | 360 |
| 19 | C | 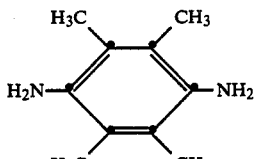 | 50 Mol-% | 0 372 | 371 |
| | | 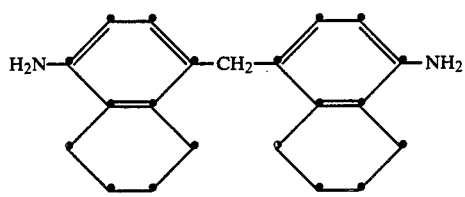 | 25 Mol-% | | |
| | | 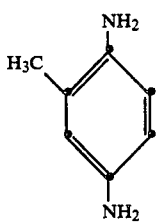 | 25 Mol-% | | |

TABLE 1-continued

| Example | Dianhydride | Diamine | η inh (dl/g) | Tg (°C.) |
|---|---|---|---|---|
| 20 | D | 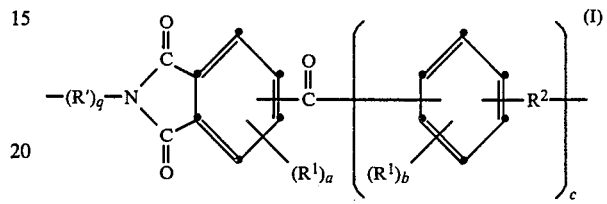 | 0.322 | 377 |

(B) EXAMPLES OF APPLICATIONS

A thin film of polymer is produced by whirler-coating a plastic plate lined with copper on one side with a 5% polymer solution, and then removing the solvent in a circulating air oven. The sovlent used is N-methylpyrrolidone.

The plates thus coated are exposed at room temperature from a distance of 18 cm through a photomask (Stouffer wedge) to a 1000-watt UV lamp. The exposed plates are then developed with a solvent, the unexposed portions of the polymer film being dissolved away. The relief image is then rendered visible by removing the exposed copper layer by etching with FeCl$_3$ solution.

The exposure time, the developer used and the photosensitivity (21-step Stouffer sensitivity guide) are shown in the following table.

TABLE

| Polymer according to Example | Exposure time (seconds) | Developer | Sensitivity (Stouffer scale) |
|---|---|---|---|
| 1 | 60 | NMP | 8 |
| 2 | 20 | NMP | 6 |
| 3 | 90 | NMP | 7 |
| 4 | 120 | NMP | 6 |
| 5 | 500 | m-Cresol | 3 |
| 7 | 400 | m-Cresol | 4 |
| 8 | 500 | Xylene/CHCl$_3$ | 2 |
| 9 | 180 | NMP | 6 |
| 10 | 300 | NMP | 5 |
| 11 | 600 | NMP | 2 |
| 12 | 600 | NMP | 2 |
| 14 | 180 | NMP | 6 |
| 15 | 60 | NMP | 9 |
| 16 | 240 | CHCl$_3$ | 6 |
| 17 | 180 | CHCl$_3$ | 5 |
| 18 | 900 | NMP/CHCl$_3$ | 2 |
| 19 | 240 | Cyclohexanone | 5 |
| 20 | 240 | NMP/CHCl$_3$ | 4 |

What is claimed is:

1. A process for the preparation of a protective film which comprises
irradiating with high-energy radiation a coated material composed of a substrate to which has been applied a layer of homopolymer or copolymer having an average molecular weight of at least 2000 and which contains at least 5 mole %, relative to the polymer, of at least one structural element of the formula I or II

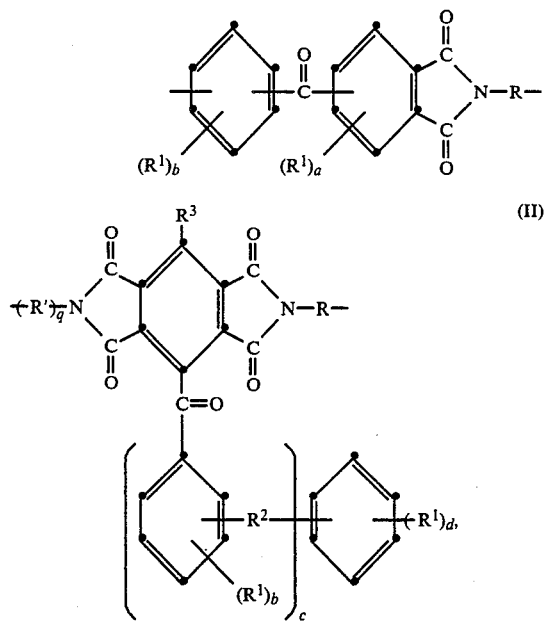

in which $R^1$ is halogen, nitro or $C_1$-$C_6$-alkyl, $C_1$-$C_6$-alkoxy or $C_1$-$C_6$-alkylthio, each of which can be substituted by phenyl, or is phenyl, phenoxy or phenylthio, $R^2$ is a direct bond, —O—, —S—, —CH$_2$—, ethylidene, 2,2-propylidene or —CO—, $R^3$ is a hydrogen atom or aroyl or is as defined for $R^1$, a is 0, 1, 2 or 3, b is 0, 1, 2, 3 or 4, c and d are 0, 1, 2, 3, 4 or 5 and q is 0 or 1, and R and R' are a substituted or unsubstituted divalent aliphatic radical which can be interrupted by hetero-atoms or by aromatic, heterocyclic or cycloaliphatic groups, or are a substituted or unsubstituted, cycloaliphatic or araliphatic radical, an aromatic radical in which two aryl nuclei are linked via an aliphatic group, or an aromatic radical which is substituted by at least one alkyl group, cycloalkyl group, alkoxy group, alkoxyalkyl group, alkylthio group, alkylthioalkyl group or aralkyl group, or two adjacent C atoms of the aromatic radical are substituted by an alkylene group, R being an aromatic radical which is substituted in the two ortho-positions relative to at least one N atom of two adjacent C atoms of the aromatic radical are substituted by alkylene, if q is 0.

2. A process according to claim 1 wherein the structural elements have the formula Ia, Ib or IIa

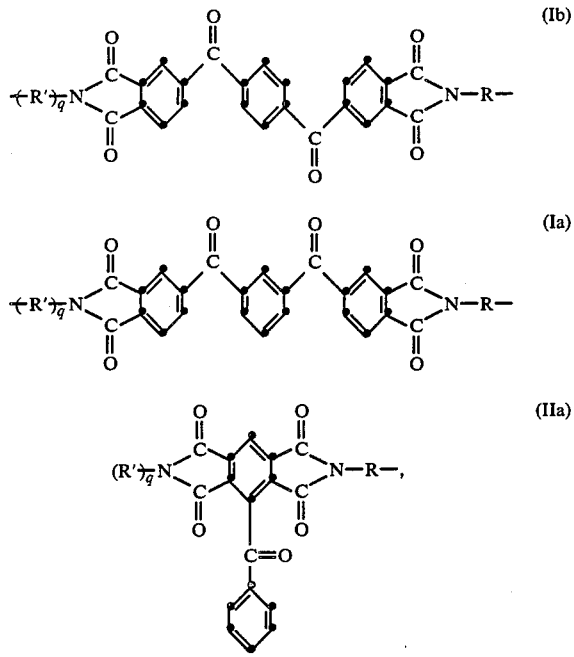

in which q, R and R' are as defined in claim 1.

3. A process according to claim 1 where in the polymer the substituent is alkyl, alkoxy or alkoxyalkyl having 1 to 6 C atoms, benzyl, trimethylene or tetramethylene.

4. A process according to claim 1 where in the polymer one or two substituents in the aromatic radical are attached in the ortho-position relative to the N atom.

5. A process according to claim 1 where in the polymer R as an aliphatic radical contains 2 to 30 C atoms, as a cycloaliphatic radical contains 5 to 8 ring C atoms, as an araliphatic radical contains 7 to 30 C atoms, as an aromatic radical having aryl nuclei linked via an aliphatic group contains 13 to 30 C atoms and as a substituted aromatic radical contains 7 to 30 C atoms.

6. A process according to claim 1 wherein the homopolymer or copolymer is selected from the group consisting of the polyimides, polyamides, saturated polyesters, polycarbonates, polyamide-imides, polyesterimides, polyester-amides, polysiloxanes, unsaturated polyesters, epoxide resins, aromatic polyethers, aromatic polyether-ketones, aromatic polyether sulfones, aromatic polyketones, aromatic polythioethers and mixtures of these polymers.

7. A process according to claim 6 wherein the polymer comprises a homopolyimide or copolyimide containing 5 to 100 mole % of structural elements of the formulae I and/or II in which q is 0 and R is an aromatic radical which is substituted in the two ortho-positions of at least one N atom by alkyl, cycloalkyl, alkoxy, alkoxyalkyl, alkylthio, alkylthioalkyl or aralkyl, or two adjacent C atoms of the aromatic radical are substituted by alkylene, and containing 0 to 95 mole % of structural elements of the formula III

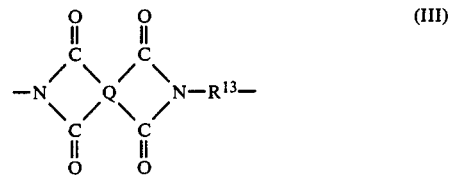

in which Q is a tetravalent organic radical and $R^{13}$ is a divalent organic radical and $R^{13}$ is as defined for R.

8. A process according to claim 7 wherein Q is

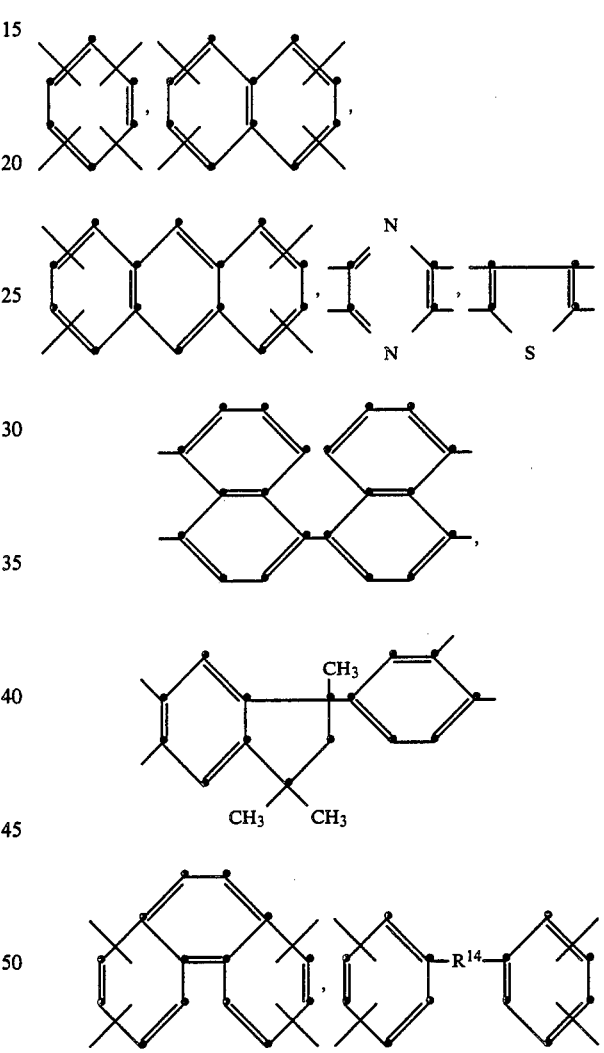

in which $R^{14}$ is a direct bond or a bridge group of the formulae

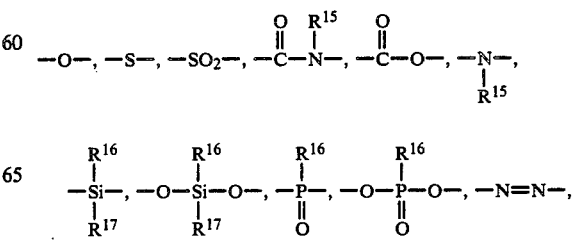

-continued

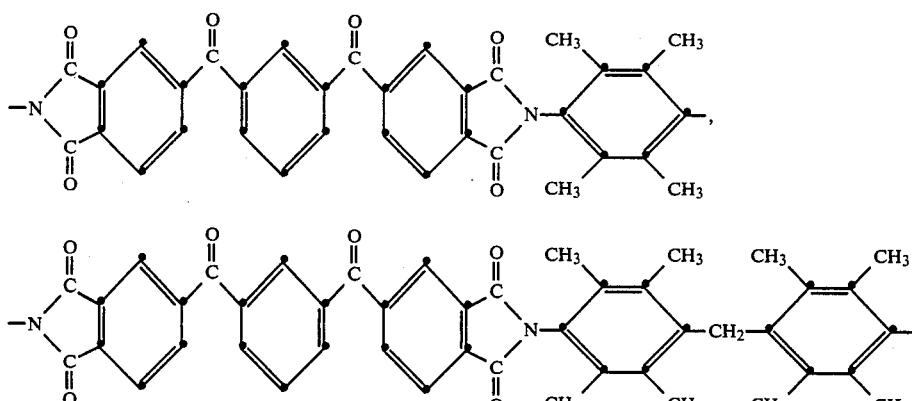

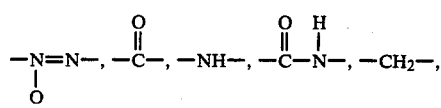

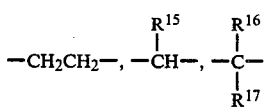

in which $R^{15}$, $R^{16}$ and $R^{17}$ are alkyl having 1 to 6 C atoms, phenyl or benzyl, and $R^{16}$ and $R^{17}$ are alkoxy having 1 to 6 C atoms, phenoxy or benzyloxy.

9. A process according to claim 7 wherein R in formula I and II is a radical of the formulae

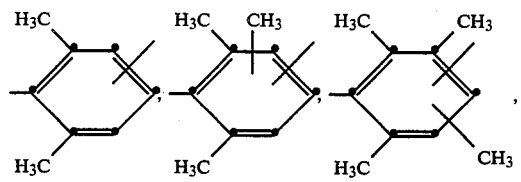

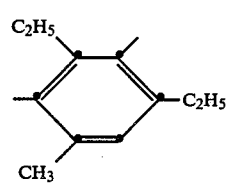

in which the free bonds are in the meta-position or para-position relative to one another, or of the formula

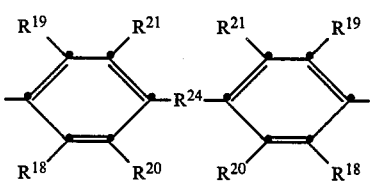

in which $R^{18}$ and $R^{19}$ independently are methyl, ethyl, n-propyl or isopropyl and $R^{20}$ and $R^{21}$ are a hydrogen atom or are as defined for $R^{19}$, or $R^{18}$ and $R^{20}$ together are trimethylene or tetramethylene, and $R^{20}$ and $R^{22}$ are a hydrogen atom and $R^{24}$ is a direct bond, $CH_2$ or CO.

10. A process according to claim 1 wherein the polymer consists of recurring structural elements of the formulae or mixtures of these structural elements.

11. A process for the preparation of a photographic relief image which comprises
irradiating with high-energy radiation imagewise through a photomask a coated material composed of a substrate to which has been applied a layer of homopolymer or copolymer, having an average molecular weight of at least 2000 and which contains at least 5 mole %, relative to the polymer, of at least one structural element of the formula I or II

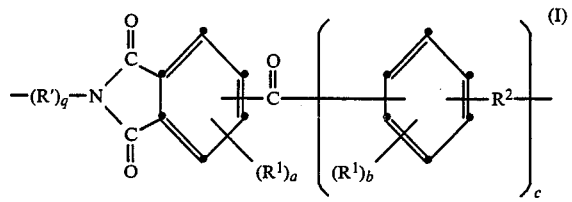

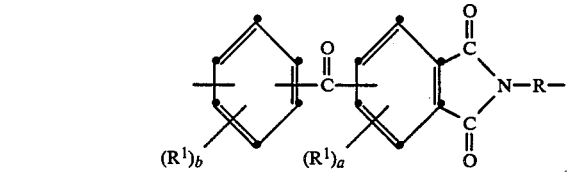

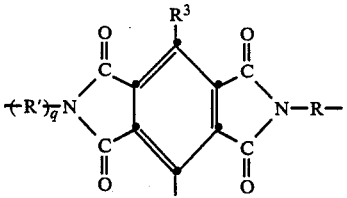

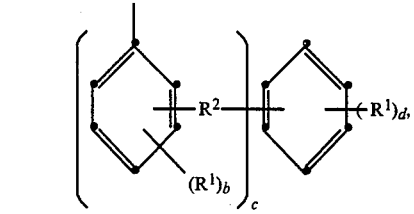

in which $R^1$ is halogen, nitro or $C_1-C_6$-alkyl, $C_1-C_6$-alkoxy or $C_1-C_6$-alkylthio, each of which can be substituted by phenyl, or is phenyl, phenoxy or phenylthio, $R^2$ is a direct bond, —O—, —S—, —$CH_2$—, ethylidene, 2,2-propylidene or —CO—, $R^3$ is a hydrogen atom or aroyl or is as defined for $R^1$, a is 0, 1, 2 or 3, b is 0, 1, 2, 3 or 4, c and d are 0, 1, 2, 3, 4 or 5 and q is 0 or 1, and R and R' are a substituted or unsubstituted divalent aliphatic radical which can be interrupted by hetero-atoms or by aromatic, heterocyclic or cycloaliphatic groups, or are a substituted or unsubstituted, cycloaliphatic or araliphatic radical, an aromatic radical in which two aryl nuclei are linked via an aliphatic group, or an aromatic radical which is substituted by at least one alkyl group, cycloalkyl group, alkoxy group, alkoxyalkyl group, alkylthio group, alkylthioalkyl group or aralkyl group, or two adjacent C atoms of the aromatic radical are substituted by an alkylene group, R being n aromatic radical which is substituted in the two ortho-positions relative to at least one N atom or two adjacent C atoms of the aromatic radical are substituted by alkylene, if q is 0, and then removing the unexposed portions with a developer.

12. A process according to claim 11 wherein the structural elements have the formula Ia, Ib or IIa

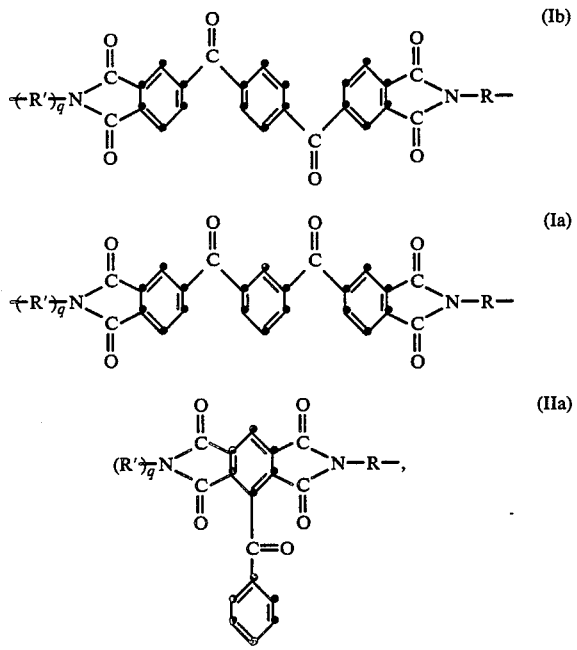

in which q, R and R' are as defined in claim 11.

13. A process according to claim 11 where in the polymer the substituent is alkyl, alkoxy or alkoxyalkyl having 1 to 6 C atoms, benzyl, trimethylene or tetramethylene.

14. A process according to claim 11 where in the polymer one or two substituents in the aromatic radical are attached in the ortho-position relative to the N atom.

15. A process according to claim 11 where in the polymer R as an aliphatic radical contains 2 to 30 C atoms, as a cycloaliphatic radical contains 5 to 8 ring C atoms, as an araliphatic radical contains 7 to 30 C atoms, as an aromatic radical having aryl nuclei linked via an aliphatic group contains 13 to 30 C atoms and as a substituted aromatic radical contains 7 to 30 C atoms.

16. A process according to claim 11 wherein the homopolymer or copolymer is selected from the group consisting of the polyimides, polyamides, saturated polyesters, polycarbonates, polyamide-imides, polyester-imides, polyester-amides, polysiloxanes, unsaturated polyesters, epoxide resins, aromatic polyethers, aromatic polyether-ketones, aromatic polyether sulfones, aromatic polyketones, aromatic polythioethers and mixtures of these polymers.

17. A process according to claim 16 wherein the polymer comprises a homopolyimide or copolyimide containing 5 to 100 mole % of structural elements of the formulae I and/or II in which q is 0 and R is an aromatic radical which is substituted in the two ortho-positions of at least one N atom by alkyl, cycloalkyl, alkoxy, alkoxyalkyl, alkylthio, alkylthioalkyl or aralkyl, or two adjacent C atoms of the aromatic radical are substituted by alkylene, and containing 0 to 95 mole % of structural elements of the formula III

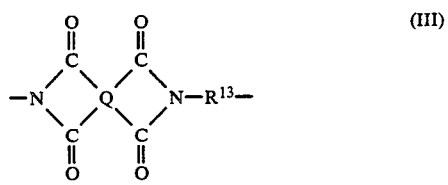

in which Q is a tetravalent organic radical and $R^{13}$ is a divalent organic radical and $R^{13}$ is as defined for R.

18. A process according to claim 17 wherein Q is

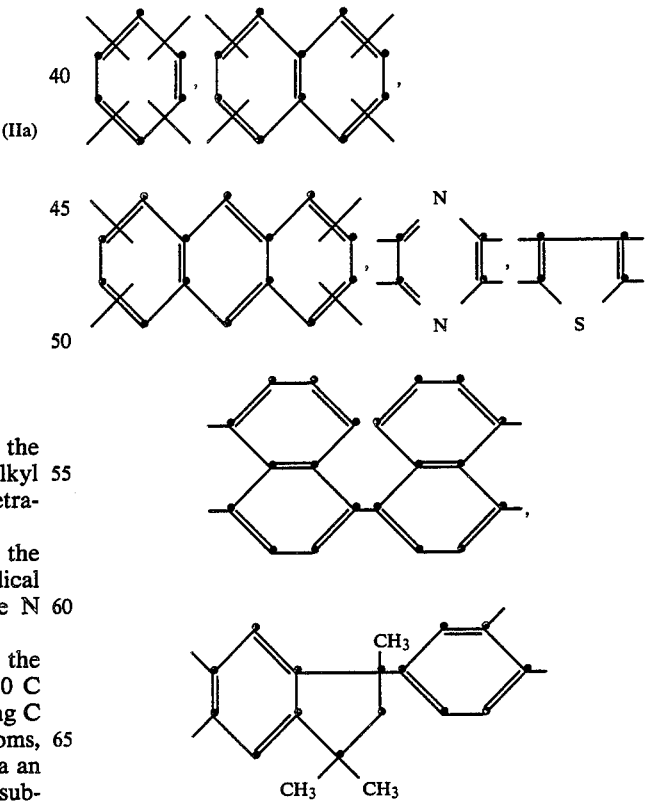

-continued

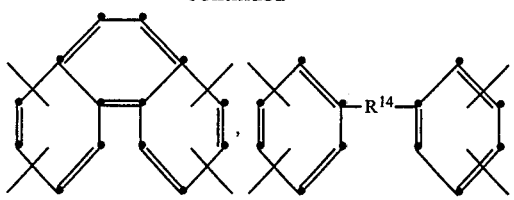

in which R[14] is a direct bond or a bridge group of the formulae

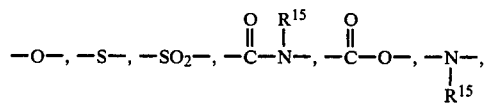

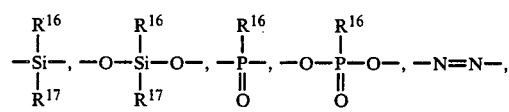

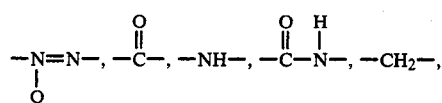

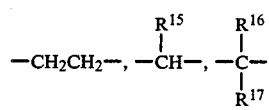

in which R[15], R[16] and R[17] are alkyl having 1 to 6 C atoms, phenyl or benzyl, and R[16] and R[17] are alkoxy having 1 to 6 C atoms, phenoxy or benzyloxy.

19. A process according to claim 17 wherein R in formula I and II is a radical of the formula

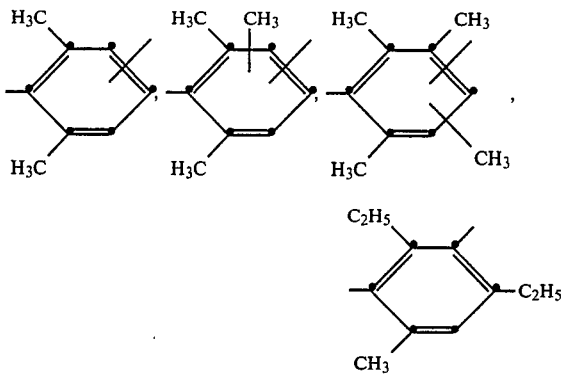

in which the free bonds are in the meta-position or para-position relative to one another, or of the formula

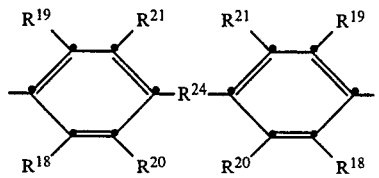

in which R[18] and R[19] independently are methyl, ethyl, n-propyl or isopropyl and R[20] and R[21] are a hydrogen atom or are as defined for R[19], or R[18] or R[20] together are trimethylene or tetramethylene, and R[20] and R[22] are a hydrogen atom and R[24] is a direct bond, CH$_2$ or CO.

20. A process according to claim 11 wherein the polymer consists of recurring structural elements of the formulae

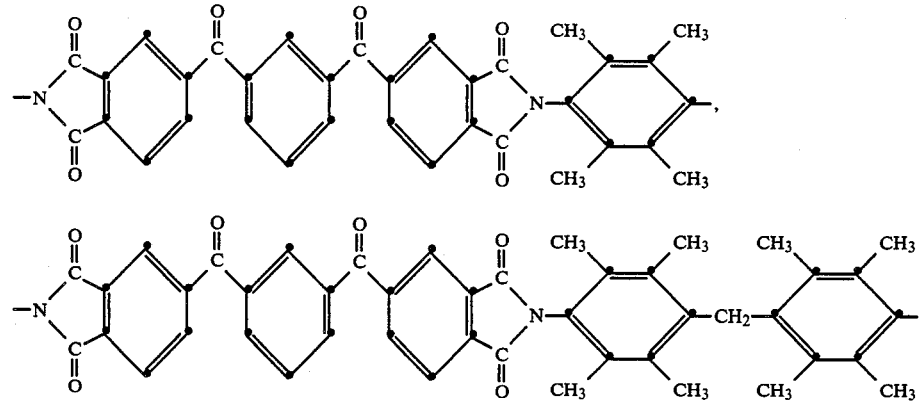

or mixtures of these structural elements.

* * * * *